(12) United States Patent
Mailloux et al.

(10) Patent No.: US 7,103,742 B1
(45) Date of Patent: Sep. 5, 2006

(54) BURST/PIPELINED EDO MEMORY DEVICE

(75) Inventors: Jeffrey S. Mailloux, Boise, ID (US);
Kevin J. Ryan, Meridian, ID (US);
Todd A. Merritt, Boise, ID (US); Brett L. Williams, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 616 days.

(21) Appl. No.: 08/984,560

(22) Filed: Dec. 3, 1997

(51) Int. Cl.
*G06F 13/00* (2006.01)

(52) U.S. Cl. .................. 711/170; 711/105; 365/189.01; 714/718; 714/719; 710/316

(58) Field of Classification Search .......... 711/105, 711/115, 170, 171, 172; 365/189.01; 395/556, 395/559; 713/2, 100; 714/718, 719; 710/316; 371/21.1, 2, 21.6
See application file for complete search history.

(56) References Cited

U.S. PATENT DOCUMENTS

| | | | |
|---|---|---|---|
| 4,344,156 A | 8/1982 | Eaton et al. | 365/203 |
| 4,484,308 A | 11/1984 | Lewandowski et al. | 365/900 |
| 4,519,028 A | 5/1985 | Olsen et al. | 395/559 |
| 4,562,555 A | 12/1985 | Ouchi et al. | 365/233 |
| 4,567,579 A | 1/1986 | Patel et al. | 365/189 |
| 4,575,825 A | 3/1986 | Ozaki et al. | 365/189 |
| 4,603,403 A | 7/1986 | Toda | 365/189 |
| 4,618,947 A | 10/1986 | Tran et al. | 365/230 |
| 4,649,522 A | 3/1987 | Kirsch | 365/189 |
| 4,685,089 A | 8/1987 | Patel et al. | 365/233 |

(Continued)

FOREIGN PATENT DOCUMENTS

WO    WO-96/20482    7/1996

OTHER PUBLICATIONS

Micron, "1996 DRAM Data Book", pp. 5–75 + 7–62, Dec. 1995.*

Toshiba America Electronic Components, Inc., "Application Specific DRAM, 1994", pp. C–178, C–260, C218.

Micron Semiconductor, Inc., "Synchronous DRAM 2 MEG x 8 SDRAM", pp. 2–3 through 2–6, Rev. Apr. 1994.

(Continued)

*Primary Examiner*—Hong Kim
(74) *Attorney, Agent, or Firm*—Schwegman, Lundberg, Woessner & Kluth, P.A.

(57) ABSTRACT

An integrated circuit memory device is designed for high speed data access and for compatibility with existing memory systems. An address strobe signal is used to latch a first address. During a burst access cycle the address is incremented internal to the device with additional address strobe transitions. A new memory address is only required at the beginning of each burst access. Read/Write commands are issued once per burst access eliminating the need to toggle the Read/Write control line at the device cycle frequency. Transitions of the Read/Write control line during a burst access will terminate the burst access, reset the burst length counter and initialize the device for another burst access. The device is compatible with existing Extended Data Out DRAM device pinouts, Fast Page Mode and Extended Data Out Single In-Line Memory Module pinouts, and other memory circuit designs. Additionally, a DRAM is provided having both pipelined and burst Extended Data Out modes of operation and the ability to switch between them. Additionally, a memory device switchable between a patterned and a patternless addressing scheme is provided.

24 Claims, 19 Drawing Sheets

U.S. PATENT DOCUMENTS

| | | | |
|---|---|---|---|
| 4,707,811 A | 11/1987 | Takemae et al. | 365/239 |
| 4,758,995 A | 7/1988 | Sato | 365/230 |
| 4,766,431 A | 8/1988 | Kobayashi et al. | 340/799 |
| 4,788,667 A | 11/1988 | Nakano et al. | 365/193 |
| 4,851,990 A | 7/1989 | Johnson et al. | 395/280 |
| 4,870,622 A | 9/1989 | Aria et al. | 365/230.02 |
| 4,875,192 A | 10/1989 | Matsumoto | 365/193 |
| 4,899,312 A | 2/1990 | Sato | 365/230.09 |
| 4,985,641 A | 1/1991 | Nagayama et al. | 307/272.3 |
| 5,058,066 A | 10/1991 | Yu | 365/189.05 |
| 5,126,975 A | 6/1992 | Handy et al. | 365/230.01 |
| 5,146,582 A | 9/1992 | Begun | 395/280 |
| 5,175,835 A | 12/1992 | Beighe et al. | 711/212 |
| 5,267,200 A | 11/1993 | Tobita | 365/189.5 |
| 5,268,865 A | 12/1993 | Takasugi | 365/189.05 |
| 5,280,594 A | 1/1994 | Young et al. | 395/425 |
| 5,305,284 A | 4/1994 | Iwase | 365/238.5 |
| 5,319,759 A | 6/1994 | Chan | 365/230.08 |
| 5,325,330 A | 6/1994 | Morgan | 365/189.05 |
| 5,325,502 A | 6/1994 | McLaury | 395/425 |
| 5,327,390 A | 7/1994 | Takasugi | 365/230.08 |
| 5,331,471 A | 7/1994 | Gilbert | 365/189.05 |
| 5,331,593 A | 7/1994 | Merritt et al. | 365/189.11 |
| 5,349,566 A | 9/1994 | Merritt et al. | 365/233.5 |
| 5,357,469 A | 10/1994 | Sommer et al. | 365/193 |
| 5,369,622 A | 11/1994 | McLaury | 365/233 |
| 5,373,227 A | 12/1994 | Keeth | 323/313 |
| 5,373,469 A | 12/1994 | Akioka et al. | |
| 5,379,261 A | 1/1995 | Jones, Jr. | 365/230.01 |
| 5,392,239 A | 2/1995 | Margulis et al. | 365/189 |
| 5,410,670 A | 4/1995 | Hansen et al. | 395/425 |
| 5,426,606 A | 6/1995 | Takai | 365/230.06 |
| 5,452,261 A | 9/1995 | Chung et al. | 265/233 |
| 5,457,659 A | 10/1995 | Schaefer | 365/222 |
| 5,526,320 A | 6/1996 | Zagar et al. | 365/233.5 |
| 5,555,209 A | 9/1996 | Smith et al. | |
| 5,564,028 A | 10/1996 | Swoboda et al. | |
| 5,568,445 A | 10/1996 | Park et al. | 365/233 |
| 5,587,964 A | 12/1996 | Rosich et al. | 365/238.5 |
| 5,610,864 A * | 3/1997 | Manning | 365/193 |
| 5,640,364 A | 6/1997 | Merritt et al. | 365/233.5 |
| 5,652,724 A * | 7/1997 | Manning | 365/189.05 |
| 5,654,932 A | 8/1997 | Rao | 365/230.03 |
| 5,661,695 A | 8/1997 | Zagar et al. | 365/233.5 |
| 5,668,773 A | 9/1997 | Zagar et al. | 365/233 |
| 5,682,354 A | 10/1997 | Manning | 365/233.5 |
| 5,713,011 A * | 1/1998 | Satoh et al. | 395/556 |
| 5,729,503 A | 3/1998 | Manning | 365/233.5 |
| 5,729,504 A | 3/1998 | Cowles | 365/236 |
| 5,737,469 A | 4/1998 | Costello et al. | |
| 5,752,269 A * | 5/1998 | Divivier et al. | 711/169 |
| 5,754,838 A * | 5/1998 | Shibata et al. | 395/559 |
| 5,838,990 A | 11/1998 | Park et al. | 395/834 |
| 5,844,849 A | 12/1998 | Furutani | 365/194 |
| 5,966,724 A * | 10/1999 | Ryan | 711/105 |
| 6,065,092 A | 5/2000 | Roy | |
| 6,615,325 B1 | 9/2003 | Mailloux et al. | |

OTHER PUBLICATIONS

Toshiba America Electronic Components, Inc., "4M DRAM 1991", pp. A–137–A–159.

Micron Semiconductor, Inc., "1994 DRAM Data Book", pp. 2–1 to 2–6.

Mosel–Vitelic V53C8257H DRAM Specification Sheet, 20 pgs.

Toshiba Corp., "Integrated Circuit Technical Data–262,144 Words x 8 Bits Multiport DRAM", TC52826TS/Z/FT/TR, TEN. Rev 2.1.

Micron Technology, Inc., "Burst EDO DRAM Information", pp. 1–126, Rev. Sep. 1995.

NEC "Command Truth Table" Mar. 15, 1993.

Samsung Electronics "KM48SV2000 Preliminary CMOS SDRAM" Rev.1(Mar, 1993), pp. 7–8.

S3 Incorporated, "S3 Burst Mode DRAM", Jun. 1993, 2 pages.

Electronic News "Mitsubishi Samples 16M Synch DRAM", Oct. 25, 1993, pp. 3–4.

"DRAM 1 Meg X 4 DRAM 5BEDO Page Mode", *1995 DRAM Data Book*, pp. 1–1 thru 1–30,, (Micron Technology, I).

"Hyper Page Mode DRAM", 8029 Electronic Engineering, 66, No. 813, Woolwich, London, GB, pp. 47–48, (Sep. 1994).

Dave Bursky, "Novel I/O Options and Innovative Architectures Let DRAMs Achieve SRAM Performance; Fast DRAMS can be swapped for SRAM Caches", Electronic Design, vol. 41, No. 15, Cleveland, Ohio, pp. 55–67, (Jul. 22, 1993).

Shiva P. Gowni, et al., "A 9NS, 32K X 9, BICMOS TTL Synchronous Cache RAM With Burst Mode Access", IEEE, Cutsom Integrated Circuits Conference, pp. 781–786, (Mar. 3, 1992).

Micron Semiconductor, Inc. "Synchronous DRAM 4 Meg x 4 SDRAM", pp. 2–1 to 2–2.

Micron Technology, Inc., "1996 DRAM Data Book", pp. 1–1 to 1–52, and 4–1 to 4–42.

Micron Technology, Inc., "1995 DRAM Data Book", pp. 3–1 to 3–37.

Performance; Fast DRAMS can be swapped for SRAM Caches, Electronic Design, vol. 41, No. 15, Cleveland, Ohio, pp. 55–67, (Jul. 22, 1993).

Micron Technology, Inc., "1995 DRAM Data Book" pp. 4–1 thru 4–42, Dec. 1995.

"Rossini, Pentium, PCI–ISA, Chip Set", Symphony Laboratories, entire book, Jun. 1995.

Samsung Electronics, "Samsung Synchronous DRAM", Mar. 1993, pp. 1–16.

Oki Electric Ind. Co., Ltd., "Burst DRAM Function & Pinout", 2nd presentation, Item #619, Sep. 1994.

Toshiba, "Pipelined Burst DRAM", Dec. 1994, JEDEC JC–42.3 Hawaii.

"Synchronous DRAM 2 MEG X 8 SDRAM", *Micron Semiconductors, Inc.*, pp. 1–18, (1994).

* cited by examiner

| Burst Length | Starting Column Address $A_2$ $A_1$ $A_0$ | | | Linear | Interleave |
|---|---|---|---|---|---|
| 2 | V | V | 0 | 0-1 | 0-1 |
|   | V | V | 1 | 1-0 | 1-0 |
| 4 | V | 0 | 0 | 0-1-2-3 | 0-1-2-3 |
|   | V | 0 | 1 | 1-2-3-0 | 1-0-3-2 |
|   | V | 1 | 0 | 2-3-0-1 | 2-3-0-1 |
|   | V | 1 | 1 | 3-0-1-2 | 3-2-1-0 |
| 8 | 0 | 0 | 0 | 0-1-2-3-4-5-6-7 | 0-1-2-3-4-5-6-7 |
|   | 0 | 0 | 1 | 1-2-3-4-5-6-7-0 | 1-0-3-2-5-4-7-6 |
|   | 0 | 1 | 0 | 2-3-4-5-6-7-0-1 | 2-3-0-1-6-7-4-5 |
|   | 0 | 1 | 1 | 3-4-5-6-7-0-1-2 | 3-2-1-0-7-6-5-4 |
|   | 1 | 0 | 0 | 4-5-6-7-0-1-2-3 | 4-5-6-7-0-1-2-3 |
|   | 1 | 0 | 1 | 5-6-7-0-1-2-3-4 | 5-4-7-6-1-0-3-2 |
|   | 1 | 1 | 0 | 6-7-0-1-2-3-4-5 | 6-7-4-5-2-3-0-1 |
|   | 1 | 1 | 1 | 7-0-1-2-3-4-5-6 | 7-6-5-4-3-2-1-0 |

FIG. 2

| PIN # | SYMBOL | PIN # | SYMBOL | PIN # | SYMBOL | PIN # | SYMBOL |
|---|---|---|---|---|---|---|---|
| 1 | Vss | 19 | A10 | 37 | NC | 55 | DQ12 |
| 2 | DQ1 | 20 | DQ5 | 38 | NC | 56 | DQ28 |
| 3 | DQ17 | 21 | DQ21 | 39 | Vss | 57 | DQ13 |
| 4 | DQ2 | 22 | DQ6 | 40 | /CAS0 | 58 | DQ29 |
| 5 | DQ18 | 23 | DQ22 | 41 | /CAS2 | 59 | Vcc |
| 6 | DQ3 | 24 | DQ7 | 42 | /CAS3 | 60 | DQ30 |
| 7 | DQ19 | 25 | DQ23 | 43 | /CAS1 | 61 | DQ14 |
| 8 | DQ4 | 26 | DQ8 | 44 | /RAS0 | 62 | DQ31 |
| 9 | DQ20 | 27 | DQ24 | 45 | /RAS1 | 63 | DQ15 |
| 10 | Vcc | 28 | A7 | 46 | /OE | 64 | DQ32 |
| 11 | PD5 | 29 | NC | 47 | /WE | 65 | DQ16 |
| 12 | A0 | 30 | Vcc | 48 | PD ECC | 66 | PD EDO |
| 13 | A1 | 31 | A8 | 49 | DQ9 | 67 | PD1 |
| 14 | A2 | 32 | A9 | 50 | DQ25 | 68 | PD2 |
| 15 | A3 | 33 | NC | 51 | DQ10 | 69 | PD3 |
| 16 | A4 | 34 | NC | 52 | DQ26 | 70 | PD4 |
| 17 | A5 | 35 | NC | 53 | DQ11 | 71 | PD refresh |
| 18 | A6 | 36 | NC | 54 | DQ27 | 72 | Vss |

BURST/PIPELINED EDO MEMORY DEVICE

This application is a divisional of application Ser. No. 08/650,719, filed May 20, 1996, which is a Continuation-In-Part of application Ser. No. 08/584,600, filed Jan. 1, 1996, now U.S. Pat. No. 5,966,724.

CROSS-REFERENCE TO RELATED APPLICATION

The below listed applications, as indicated by serial number and filing date, are all assigned to the assignee of the instant application and were or are with and related to the instant application: Ser. No. 08/370,761, filed Dec. 23, 1994, now U.S. Pat. No. 5,526,320, issued Jun. 11, 1996; Ser. No. 08/386,894, filed Feb. 10, 1995, now U.S. Pat. No. 5,610,864, issued Mar. 11, 1997; Ser. No. 08/386,563, filed Feb. 10, 1995, now U.S. Pat. No. 5,652,724, issued Jul. 29, 1997; Ser. No. 08/457,650, filed Jun. 1, 1995, pending; Ser. No. 08/457,651, filed Jun. 1, 1995, now U.S. Pat. No. 5,675,549, issued Oct. 7, 1997; Ser. No. 0497,354, filed Jun. 30, 1995, now U.S. Pat. No. 5,598,376, issued Jan. 28, 1997; Ser. No. 08/505,576, filed Jul. 20, 1995, abandoned; Ser. No. 08/553,156, filed Nov. 7, 1995, now U.S. Pat. No. 5,721,859, issued Feb. 24, 1998; Ser. No. 08/506,438, filed Jul. 24, 1995, now U.S. Pat. No. 5,729,503, issued Mar. 17, 1998; Ser. No. 08/630,279, filed Apr. 11, 1996, now U.S. Pat. No. 5,661,695, issued Aug. 26, 1997.

FIELD OF THE INVENTION

This invention relates to memory device architectures designed to provide high density data storage with high speed read and write access cycles, and more particularly to dynamic random access memory, which is switch selectable between burst and pipelined modes.

BACKGROUND OF THE INVENTION

Dynamic Random Access Memory devices (DRAMs) are among the highest volume and most complex integrated circuits manufactured today. Except for their high volume production, the state of the art manufacturing requirements of these devices would cause them to be exorbitantly priced. Yet, due to efficiencies associated with high volume production, the price per bit of these memory devices is continually declining. The low cost of memory has fueled the growth and development of the personal computer. As personal computers have become more advanced, they in turn have required faster and more dense memory devices, but with the same low cost of the standard DRAM. Fast page mode DRAMs are the most popular standard DRAM today. In fast page mode operation, a row address strobe (/RAS) is used to latch a row address portion of a multiplexed DRAM address. Multiple occurrences of the column address strobe (/CAS) are then used to latch multiple column addresses to access data within the selected row. On the falling edge of /CAS an address is latched, and the DRAM outputs are enabled. When /CAS transitions high the DRAM outputs are placed in a high impedance state (tri-state). With advances in the production of integrated circuits, the internal circuitry of the DRAM operates faster than ever. This high speed circuitry has allowed for faster page mode cycle times. A problem exists in the reading of a DRAM when the device is operated with minimum fast page mode cycle times. /CAS may be low for as little as 15 nanoseconds, and the data access time from /CAS to valid output data (tCAC) may be up to 15 nanoseconds; therefore, in a worst case scenario there is no time to latch the output data external to the memory device. For devices that operate faster than the specifications require, the data may still only be valid for a few nanoseconds. On a heavily loaded microprocessor memory bus, trying to latch an asynchronous signal that is valid for only a few nanoseconds is very difficult. Even providing a new address every 35 nanoseconds requires large address drivers which create significant amounts of electrical noise within the system. To increase the data throughput of a memory system, it has been common practice to place multiple devices on a common bus. For example, two fast page mode DRAMs may be connected to common address and data buses. One DRAM stores data for odd addresses, and the other for even addresses. The /CAS signal for the odd addresses is turned off (high) when the /CAS signal for the even addresses is turned on (low). This interleaved memory system provides data access at twice the rate of either device alone. If the first /CAS is low for 20 nanoseconds and then high for 20 nanoseconds while the second /CAS goes low, data can be accessed every 20 nanoseconds or 50 megahertz. If the access time from /CAS to data valid is fifteen nanoseconds, the data will be valid for only five nanoseconds at the end of each 20 nanosecond period when both devices are operating in fast page mode. As cycle times are shortened, the data valid period goes to zero.

There is a demand for faster, higher density, random access memory integrated circuits which provide a strategy for integration into today's personal computer systems. In an effort to meet this demand, numerous alternatives to the standard DRAM architecture have been proposed. One method of providing a longer period of time when data is valid at the outputs of a DRAM without increasing the fast page mode cycle time is called Extended Data Out (EDO) mode. In an EDO DRAM the data lines are not tri-stated between read cycles in a fast page mode operation. Instead, data is held valid after /CAS goes high until sometime after the next /CAS low pulse occurs, or until /RAS or the output enable (/OE) goes high. Determining when valid data will arrive at the outputs of a fast page mode or EDO DRAM can be a complex function of when the column address inputs are valid, when /CAS falls, the state of /OE and when /CAS rose in the previous cycle. The period during which data is valid with respect to the control line signals (especially /CAS) is determined by the specific implementation of the EDO mode, as adopted by the various DRAM manufacturers.

Methods to shorten memory access cycles tend to require additional circuitry, additional control pins and nonstandard device pinouts. The proposed industry standard synchronous DRAM (SDRAM) for example has an additional pin for receiving a system clock signal. Since the system clock is connected to each device in a memory system, it is highly loaded, and it is always toggling circuitry in every device. SDRAMs also have a clock enable pin, a chip select pin and a data mask pin. Other signals which appear to be similar in name to those found on standard DRAMs have dramatically different functionality on a SDRAM. The addition of several control pins has required a deviation in device pinout from standard DRAMs which further complicates design efforts to utilize these new devices. Significant amounts of additional circuitry are required in the SDRAM devices which in turn result in higher device manufacturing costs.

In order for existing computer systems to use an improved device having a nonstandard pinout, those systems must be extensively modified. Additionally, existing computer system memory architectures are designed such that control and address signals may not be able to switch at the frequencies required to operate the new memory device at high speed due to large capacity loads on the signal lines. The Single In-Line Memory Module (SIMM) provides an example of what has become an industry standard form of packaging memory in a computer system. On a SIMM, all address lines connect to all DRAMs. Further, the row address strobe (/RAS) and the write enable (/WE) are often connected to each DRAM on the SIMM. These lines inherently have high capacitive loads as a result of the number of device inputs driven by them. SIMM devices also typically ground the output enable (/OE) pin making /OE a less attractive candidate for providing extended functionality to the memory devices.

There is a great degree of resistance to any proposed deviations from the standard SIMM design due to the vast number of computers which use SIMMs. Industry's resistance to radical deviations from the standard, and the inability of current systems to accommodate the new memory devices will delay their widespread acceptance. Therefore only limited quantities of devices with radically different architectures will be manufactured initially. This limited manufacture prevents the reduction in cost which typically can be accomplished through the manufacturing improvements and efficiencies associated with a high volume product.

Additionally, there is a demand for multi-functional random access memory integrated circuits which provide a strategy for integration into systems having differing memory needs. Some applications use random memory access, while other applications use sequential memory access. However, prior asynchronous DRAMs did not have both burst and pipelined modes of operation. Thus, such prior asynchronous DRAMs did not support applications requiring both modes of operation. Consequently, the need arose for an asynchronous DRAM which had both burst and pipelined modes of operation.

SUMMARY OF THE INVENTION

An integrated circuit memory device with a standard DRAM pinout is designed for high speed data access and for compatibility with existing memory systems. A high speed burst mode of operation is provided where multiple sequential accesses occur following a single column address, and read data is output relative to the /CAS control signal. In the burst mode of operation the address is incremented internal to the device eliminating the need for external address lines to switch at high frequencies. Read/Write commands are issued once per burst access eliminating the need to toggle the Read/Write control line at high speeds. Only one control line per memory chip (/CAS) must toggle at the operating frequency in order to clock the internal address counter and the data input/output latches. The load on each /CAS is typically less than the load on the other control signals (/RAS, /WE and /OE) since each /CAS typically controls only a byte width of the data bus. Internal circuitry of the memory device is largely compatible with existing Extended Data Out (EDO) DRAMs. This similarity allows the two part types to be manufactured on one die with a limited amount of additional circuitry. The ability to switch between a standard non-burst mode and a high speed burst mode allows the device to be used to replace standard devices, and eliminates the need to switch to more complex high speed memory devices. Internal address generation provides for faster data access times than is possible with either fast page mode or EDO DRAMs. This high speed operation eliminates the need to interleave memory devices in order to attain a high data throughput. In contrast to the 50 megahertz interleaved memory system described above, the output data from this device will be valid for approximately 15 nanoseconds significantly easing the design of circuitry required to latch the data from the memory. The device is compatible with existing memory module pinouts including Single In-Line Memory Module (SIMM), Multi-Chip Module (MCM) and Dual In-Line Memory Module (DIMM) designs. This combination of features allows for significant system performance improvements with a minimum of design alterations.

The present invention also provides a memory device having both burst and pipelined modes of operation for page mode access. By page mode access it is meant that access occurs while /RAS is active and /CAS is cycled. In particular, the present invention provides a memory device which has both burst and pipelined EDO modes. By pipelined EDO it is meant that an external address is used on each /CAS cycle for memory access, and, in particular, the same output register stage associated with the burst EDO mode is used for the pipelined EDO mode as well. The same output register stage (data path(s)) may be used because burst and pipelined EDO modes may have the same latency. However, it is not required that the same output data path be used for both modes, nor is it required that both modes have the same latency. By external address, it is meant an address which is generated external to the memory device, whereas an internal address is generated internal to the memory device.

Burst mode is the receiving of an initial external address followed by one or more internally generated addresses based on the initial external address in order to access a memory array. In the case of page mode access, this is typically done while holding one enable signal active and cycling another enable signal. Addresses are incremented internally with aid of the cycled enable signal. Such addresses are typically generated in accordance with a determined pattern, including but not limited to sequential as to columns.

In pipelined mode, address information is divided into operational times. As address information passes through a memory, it is operative in one operational area before moving onto another operational area. However, once moved, another set of address information may enter the operational area exited. Thus, by time slicing address information, accesses to a memory may overlap without conflicting. This allows for a continuous data stream of address information in the form of external addresses. Therefore, internal addresses are not generated in pipelined mode. Rather, addresses are provided from an external source as a stream of data. In page mode, with one enable signal held active and another enable signal cycled, an external address is received on each cycle of the cycled enable signal. For example, if /RAS is held active, and /CAS is cycled, a random or determined order of columns associated with the row address may be accessed in pipelined mode, whereas in burst mode, a predetermined pattern of columns may be accessed.

The memory device of the present invention provides a newburst signal from control logic. The newburst signal is fed to a multiplexer for choosing which type of addressing is to occur. For one type of addressing, burst operation is provided beginning with an initial external address stored in a temporal storage device. Consequently, if burst operation is the selected mode of operation, then a counter is used to increment the initial external address. If, however, pipelined operation is the selected mode of operation, then one external address after another may be fed to the memory device in a pipelined manner.

Additionally, the present invention facilitates an integrated circuit chip with pinouts identical to those of prior asynchronous memories. Alternatively, the present invention provides a new pinout which includes a pin which may be assigned to accept an external mode select control signal. The present invention also provides a memory module having external mode select control.

Owing to the additional functionality provided by a memory device of the present invention, many mode switching or mode register programming embodiments in accordance with the present invention are possible, including but not limited to: column based switching, row-based switching, application-based switching, fixed access-based switching, and the like.

Other features and embodiments of the present invention are described or apparent from reading the detailed description or by practicing the present invention.

BRIEF DESCRIPTION OF THE DRAWINGS

The features of the invention as well as objects and advantages will be best understood by reference to the appended claims, detailed description of particular embodiments and accompanying drawings where:

FIG. 2 is a table showing linear versus interleaved addressing formats;

DETAILED DESCRIPTION OF THE PREFERRED EMBODIMENTS

Figure 1:
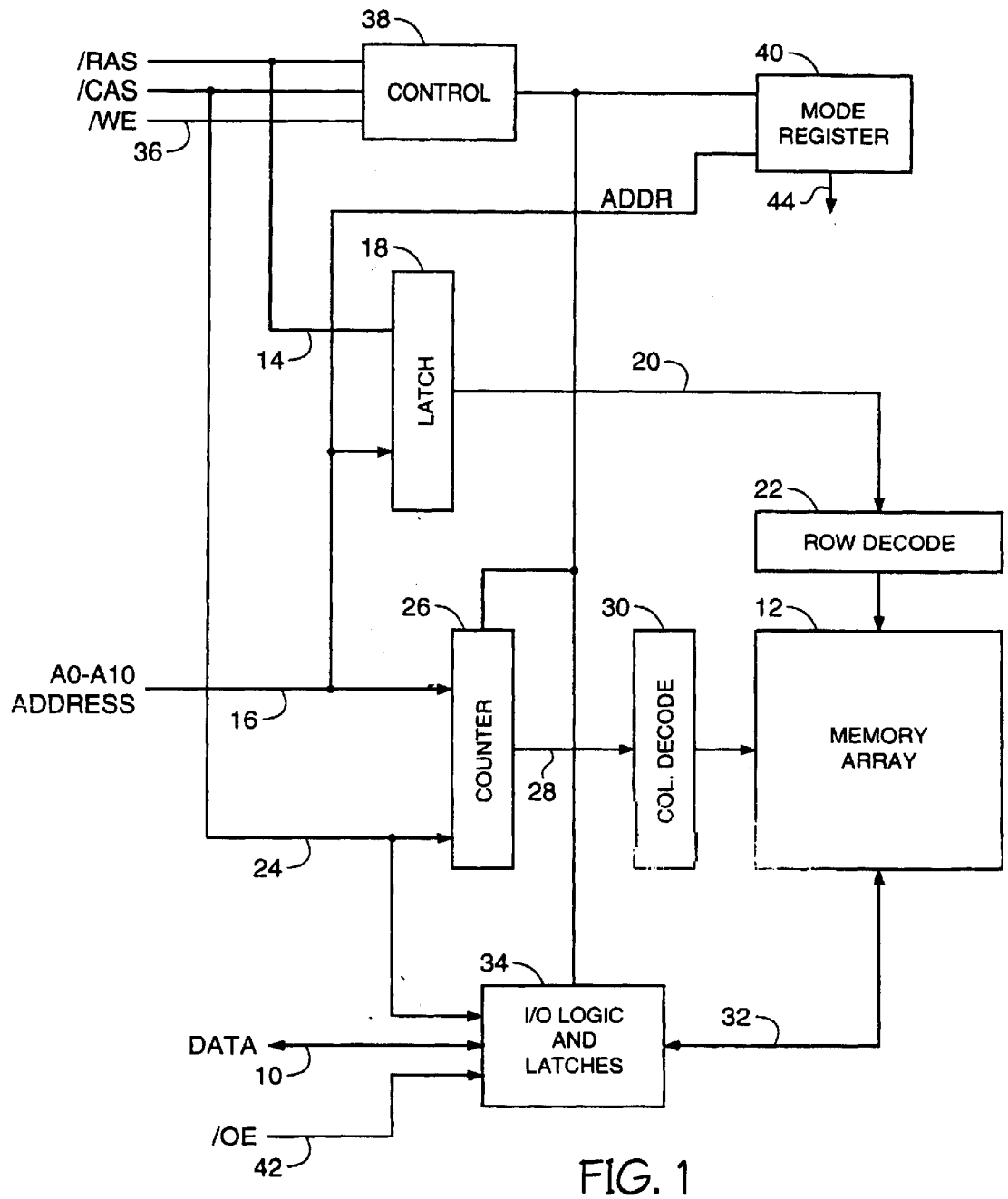
FIG. 1 is an electrical schematic diagram of a memory device in accordance with one embodiment of the invention.

FIG. 1 is a schematic representation of a sixteen megabit device designed in accordance with the present invention. The device is organized as a 2 Meg×8 burst EDO DRAM having an eight bit data input/output path 10 providing data storage for 2,097,152 bytes of information in the memory array 12. The device of FIG. 1 has an industry standard pinout for eight bit wide EDO DRAMs. An active-low row address strobe (/RAS) signal 14 is used to latch a first portion of a multiplexed memory address, from address inputs A0 through A10 16, in latch 18. The latched row address 20 is decoded in row decoder 22. The decoded row address is used to select a row of the memory array 12. A column address strobe (/CAS) signal 24 is used to latch a second portion of a memory address from address inputs 16 into column address counter 26. The latched column address 28 is decoded in column address decoder 30. The decoded column address is used to select a column of the memory array 12.

In a burst read cycle, data within the memory array located at the row and column address selected by the row and column address decoders is read out of the memory array and sent along data path 32 to output latches 34. Data 10 driven from the burst EDO DRAM may be latched external to the device in synchronization with /CAS after a predetermined number of /CAS cycle delays (latency). For a two cycle latency design, the first /CAS falling edge is used to latch the initial address for the burst access. The first burst data from the memory is driven from the memory after the second /CAS falling edge, and remains valid through the third /CAS falling edge. Once the memory device begins to output data in a burst read cycle, the output drivers 34 will continue to drive the data lines without tri-stating the data outputs during /CAS high intervals dependent on the state of the output enable and write enable (/OE and /WE) control lines, thus allowing additional time for the system to latch the output data. Once a row and a column address are selected, additional transitions of the /CAS signal are used to advance the column address within the column address counter in a predetermined sequence. The time at which data will be valid at the outputs of the burst EDO DRAM is dependent only on the timing of the /CAS signal provided that /OE is maintained low, and /WE remains high. The output data signal levels may be driven in accordance with standard CMOS, TTL, LVTTL, GTL, HSTL, among other output level specifications.

The address may be advanced linearly, or in an interleaved fashion for maximum compatibility with the overall system requirements. FIG. 2 is a table which shows linear and interleaved addressing sequences for burst lengths of 2,4 and 8 cycles. The "V" for starting addresses A1 and A2 in the table represent address values that remain unaltered through the burst sequence. The column address may be advanced with each /CAS transition, each pulse, or multiple of /CAS pulses in the event that more than one data word is read from the array with each column address. When the address is advanced with each transition of the /CAS signal, data is also driven from the part after each transition following the device latency which is then referenced to each edge of the /CAS signal. This allows for a burst access cycle where the highest switching control line (/CAS) toggles only once (high to low or low to high) for each memory cycle. This is in contrast to standard DRAMs which require /CAS to go low and then high for each cycle, and synchronous DRAMs which require a full clock cycle (high and low transitions) for each memory cycle. For maximum compatibility with existing EDO DRAM devices, the invention will be further described in reference to a device designed to latch and advance a column address on falling edges of the /CAS signal.

It may be desirable to latch and increment the column address after the first /CAS falling edge in order to apply both the latched and incremented addresses to the array at the earliest opportunity in an access cycle. For example, a device may be designed to access two data words per cycle (prefetch architecture). The memory array for a prefetch architecture device may be split into odd and even array halves. The column address least significant bit is then used to select between odd and even halves while the other column address bits select a column within each of the array halves. In an interleaved access mode with column address 1, data from columns 0 and 1 would be read and the data from column 1 would be output followed by the data from column 0 in accordance with standard interleaved addressing as described in SDRAM specifications. In a linear access mode column address 1 would be applied to the odd array half, and incremented to address 2 for accessing the even array half to fulfill the two word access. One method of implementing this type of device architecture is to provide a column address incrementing circuit between the column address counter and the even array half. The incrementing circuit would increment the column address only if the initial column address in a burst access cycle is odd, and the address mode is linear. Otherwise the incrementing circuit would pass the column address unaltered. For a design using a prefetch of two data accesses per cycle, the column address would be advance once for every two active edges of the /CAS signal. Prefetch architectures where more than two data words are accessed are also possible.

Other memory architectures applicable to the current invention include a pipelined architecture where memory accesses are performed sequentially, but each access may require more than a single cycle to complete. In a pipelined architecture the overall throughput of the memory will approach one access per cycle, but the data out of the memory may be offset by a number of cycles due to the pipeline length and/or the desired latency from /CAS.

In the burst access memory device, each new column address from the column address counter is decoded and is used to access additional data within the memory array without the requirement of additional column addresses being specified on the address inputs 16. This burst sequence of data will continue for each /CAS falling edge until a predetermined number of data accesses equal to the burst length has occurred. A /CAS falling edge received after the last burst address has been generated will latch another column address from the address inputs 16 and a new burst sequence will begin. Read data is latched and output with each falling edge of /CAS after the first /CAS latency.

For a burst write cycle, data 10 is latched in input data latches 34. Data targeted at the first address specified by the row and column addresses is latched with the /CAS signal when the first column address is latched (write cycle data latency is zero). Other write cycle data latency values are possible, however, for today's memory systems, zero is preferred. Additional input data words for storage at incremented column address locations are latched by /CAS on successive /CAS pulses. Input data from the input latches 34 is passed along data path 32 to the memory array where it is stored at the location selected by the row and column address decoders. As in the burst read cycle previously described, a predetermined number of burst access writes will occur without the requirement of additional column addresses being provided on the address lines 16. After the predetermined number of burst writes has occurred, a subsequent /CAS pulse will latch a new beginning column address, and another burst read or write access will begin.

The memory device of FIG. 1 may include the option of switching between burst EDO and standard EDO modes of operation. In this case, the write enable signal /WE 36 may be used at the row address latch time (/RAS falling, /CAS high) to determine whether memory accesses for that row will be burst or page mode cycles. If /WE is low when /RAS falls, burst access cycles are selected. If /WE is high at /RAS falling, standard extended data out (EDO) page mode cycles are selected. Both the burst and EDO page mode cycles allow for increased memory device operating frequencies by not requiring the data output drivers 34 to place the data lines 10 in a high impedance state between data read cycles while /RAS is low. DRAM control circuitry 38, in addition to performing standard DRAM control functions, controls the 10 circuitry 34 and the column address counter/latch 26 in accordance with the mode selected by /WE when /RAS falls. In a burst mode only DRAM, or in a device designed with an alternate method of switching between burst and non-burst access cycles, the state of /WE when /RAS falls may be used to switch between other possible modes of operation such as interleaved versus linear addressing modes.

The write enable signal is used in burst access cycles to select read or write burst accesses when the initial column address for a burst cycle is latched by /CAS. /WE low at the column address latch time selects a burst write access. /WE high at the column address latch time selects a burst read access. The level of the /WE signal must remain high for read and low for write burst accesses throughout the burst access. A low to high transition within a burst write access will terminate the burst access, preventing further writes from occurring. A high to low transition on /WE within a burst read access will likewise terminate the burst read access and will place the data output 10 in a high impedance state. Transitions of the /WE signal may be locked out during critical timing periods within an access cycle in order to reduce the possibility of triggering a false write cycle. After the critical timing period the state of /WE will determine whether a burst access continues, is initiated, or is terminated. Termination of a burst access resets the burst length counter and places the DRAM in a state to receive another burst access command. Both /RAS and /CAS going high during a burst access will also terminate the burst access cycle placing the data drivers in a high impedance output state, and resetting the burst length counter. Read data may remain valid at the device outputs if /RAS alone goes high while /CAS is active for compatibility with hidden refresh cycles, otherwise /RAS high alone may be used to terminate a burst access. A minimum write enable pulse width is only required when it is desired to terminate a burst read and then begin another burst read, or terminate a burst write prior to performing another burst write with a minimum delay between burst accesses. In the case of burst reads, /WE will transition from high to low to terminate a first burst read, and then /WE will transition back high prior to the next falling edge of /CAS in order to specify a new burst read cycle. For burst writes, /WE would transition high to terminate a current burst write access, then back low prior to the next falling edge of /CAS to initiate another burst write access.

A basic implementation of the device of FIG. 1 may include a fixed burst length of 4, a fixed /CAS latency of 2 and a fixed interleaved sequence of burst addresses. This basic implementation requires very little additional circuitry to the standard EDO page mode DRAM, and may be mass produced to provide the functions of both the standard EDO page mode and burst EDO DRAMs. This device also allows for the output enable pin (/OE) to be grounded for compatibility with many SIMM module designs. When not disabled (tied to ground), /OE is an asynchronous control which will prevent data from being driven from the part in a read cycle if it is inactive (high) prior to /CAS falling and remains inactive beyond /CAS rising. If these setup and hold conditions are not met, then the read data may be driven for a portion of the read cycle. It is possible to synchronize the /OE signal with /CAS, however this would typically increase the /CAS to data valid delay time and does'nt allow for the read data to be disabled prior to /RAS high without an additional /CAS low pulse which would otherwise be unnecessary. In a preferred embodiment, if /OE transitions high at any time during a read cycle the outputs will remain in a high impedance state until the next falling edge of /CAS despite further transitions of the /OE signal.

Programmability of the burst length, /CAS latency and address sequences may be accomplished through the use of a mode register 40 which latches the state of one or more of the address input signals 16 or data signals 10 upon receipt of a write-/CAS-before-/RAS (WCBR) programming cycle. In such a device, outputs 44 from the mode register control the required circuits on the DRAM. Burst length options of 2, 4, 8 and full page as well as /CAS latencies of 1, 2 and 3 may be provided. Other burst length and latency options may be provided as the operating speeds of the device increase and computer architectures evolve. The device of FIG. 1 includes programmability of the address sequence by latching the state of the least significant address bit during a WCBR cycle. The burst length and /CAS latency for this particular embodiment are fixed. Other possible alterations in the feature sets of this DRAM include having a fixed burst mode only, selecting between standard fast page mode (non-EDO) and burst mode, and using the output enable pin (/OE) 42 in combination with /RAS to select between modes of operation. Also, a WCBR refresh cycle could be used to select the mode of operation rather than a control signal in combination with /RAS. A more complex memory device may provide additional modes of operation such as switching between fast page mode, EDO page mode, static column mode and burst operation through the use of various combinations of /WE and /OE at /RAS falling time. One mode from a similar set of modes may be selected through the use of a WCBR cycle using multiple address or data lines to encode the desired mode. Alternately, a device with multiple modes of operation may have wire bond locations, or programmable fuses which may be used to program the mode of operation of the device.

A preferred embodiment of a sixteen bit wide burst EDO mode DRAM designed in accordance with the teachings of this invention has two column address strobe input pins /CASH and /CASL. For read cycles only /CASL needs to toggle. /CASH is may be high or may toggle with /CASL during burst read cycles, all sixteen data bits will be driven out of part during a read cycle even if /CASH remains inactive. In a typical system application, a microprocessor will read all data bits on a data bus in each read cycle, but may only write certain bytes of data in a write cycle. Allowing one of the /CAS control signals to remain static during read cycles helps to reduce overall power consumption and noise within the system. For burst write access cycles, each of the /CAS signals (CASH and /CASL) acts as a write enable for an eight bit width of the data. All sixteen data inputs will be latched when the first of the /CAS signals transitions low. If only one /CAS signal transitions low, then the eight bits of data associated with the /CAS that remained high will not be stored in the memory.

The present invention has been described with reference to several preferred embodiments. Just as fast page mode DRAMs and EDO DRAMs are available in numerous configurations including ×1, ×4, ×8 and ×16 data widths, and 1 Megabit, 4 Megabit, 16 Megabit and 64 Megabit densities; the memory device of the present invention may take the form of many different memory organizations. It is believed that one who is skilled in the art of integrated circuit memory design can, with the aide of this specification design a variety of memory devices which do not depart from the spirit of this invention. It is therefore believed that detailed descriptions of the various memory device organizations applicable to this invention are not necessary.

Figure 3:
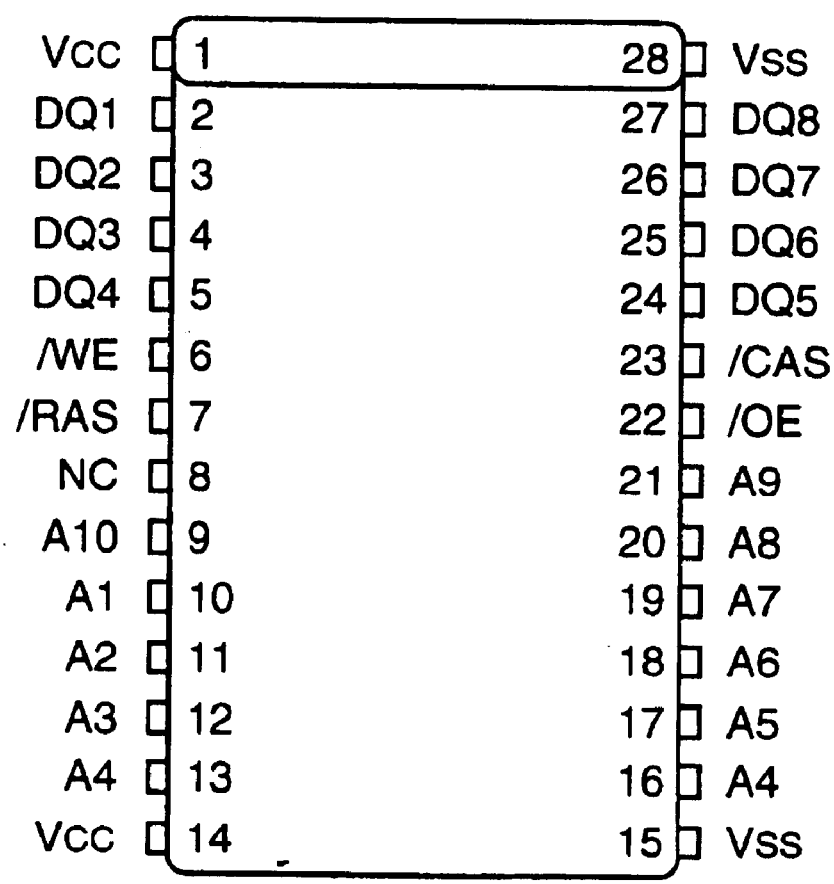
FIG. 3 is a pinout of the memory device of FIG. 1.

FIG. 3 shows a preferred pinout for the device of FIG. 1. It should be noted that the pinout for this new burst EDO memory device is identical to the pinout for a standard EDO DRAM. The common pinout allows this new device to be used in existing memory designs with minimum design changes. The common pinout also allows for ease of new designs by those of skill in the art who are familiar with the standard EDO DRAM pinout. Variations of the described invention which maintain the standard EDO DRAM pinout include driving the /CAS pin with a system clock signal to synchronize data access of the memory device with the system clock. For this embodiment, it may be desirable to use the first /CAS active edge after /RAS falls to latch the row address, a later edge may be used to latch the first column address of a burst access cycle. After row and column addresses are latched within the device, the address may be incremented internally to provide burst access cycles in synchronization with the system clock. Other pin function alternatives include driving the burst address incrementing signal on the /OE pin since the part does not require a data output disable function on this pin. Other alternate uses of the /OE pin also allow the device to maintain the standard EDO pinout, but provide increased functionality such as burst mode access. The /OE pin may be used to signal the presence of a valid column starting address, or to terminate a burst access. Each of these embodiments provides for a high speed burst access memory device which may be used in current memory systems with a minimum amount of redesign.

Figure 4:
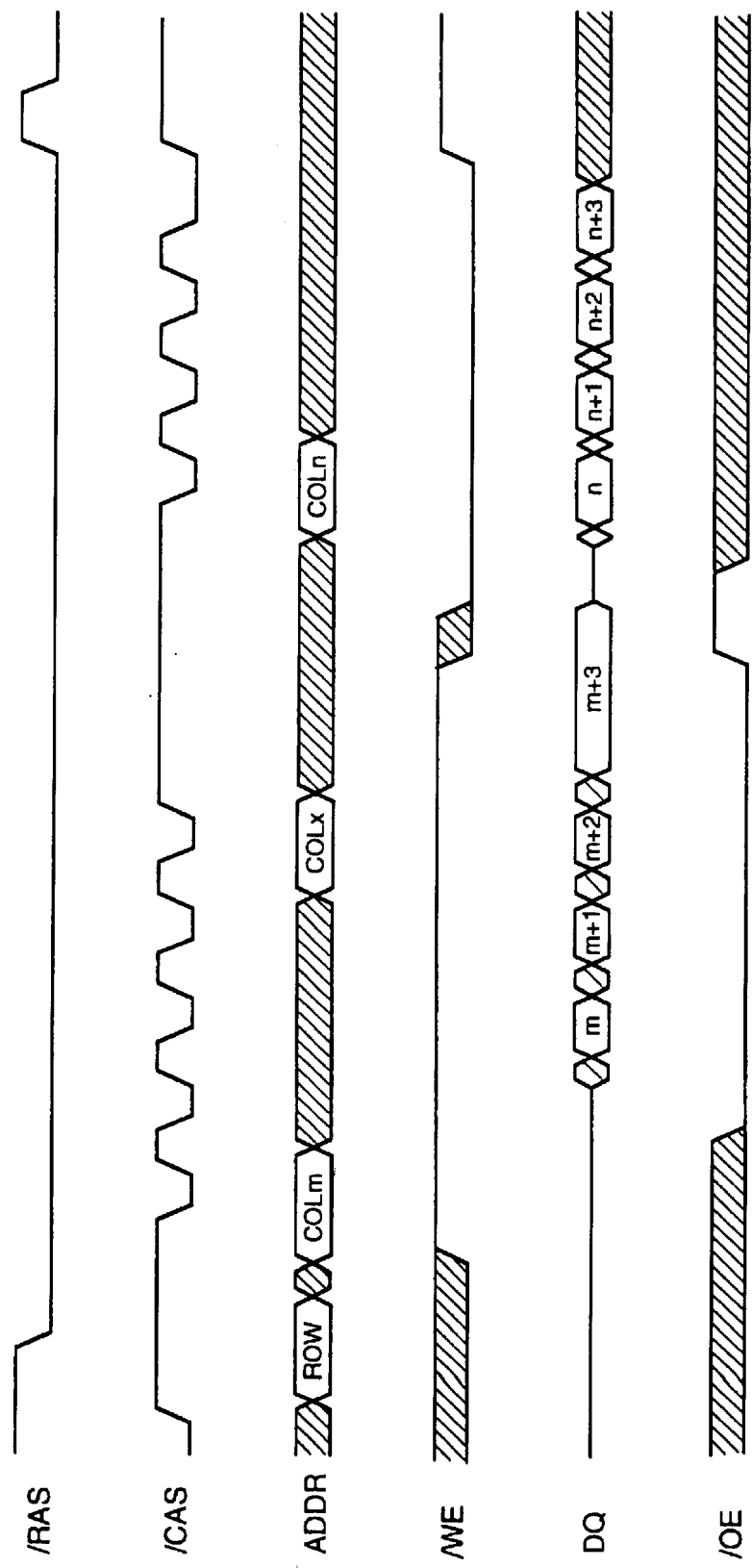
FIG. 4 is a timing diagram for a method of accessing the device of FIG. 1.

FIG. 4 is a timing diagram for performing a burst read followed by a burst write of the device of FIG. 1. In FIG. 4, a row address is latched by the /RAS signal. /WE is low when /RAS falls for an embodiment of the design where the state of the /WE pin is used to specify a burst access cycle at /RAS time. Next, /CAS is driven low with /WE high to initiate a burst read access, and the column address is latched. The data out signals (DQ's) are not driven in the first /CAS cycle. On the second falling edge of the /CAS signal, the internal address generation circuitry advances the column address and begins another access of the array, and the first data out is driven from the device after a /CAS to data access time (tCAC). Additional burst access cycles continue, for a device with a specified burst length of four, until the fifth falling edge of /CAS which latches a new column address for a new burst read access. /WE falling in the fifth /CAS cycle terminates the burst access, and initializes the device for additional burst accesses. The sixth falling edge of /CAS with /WE low is used to latch a new burst address, latch input data and begin a burst write access of the device. Additional data values are latched on successive /CAS falling edges until /RAS rises to terminate the burst access.

Figure 5:
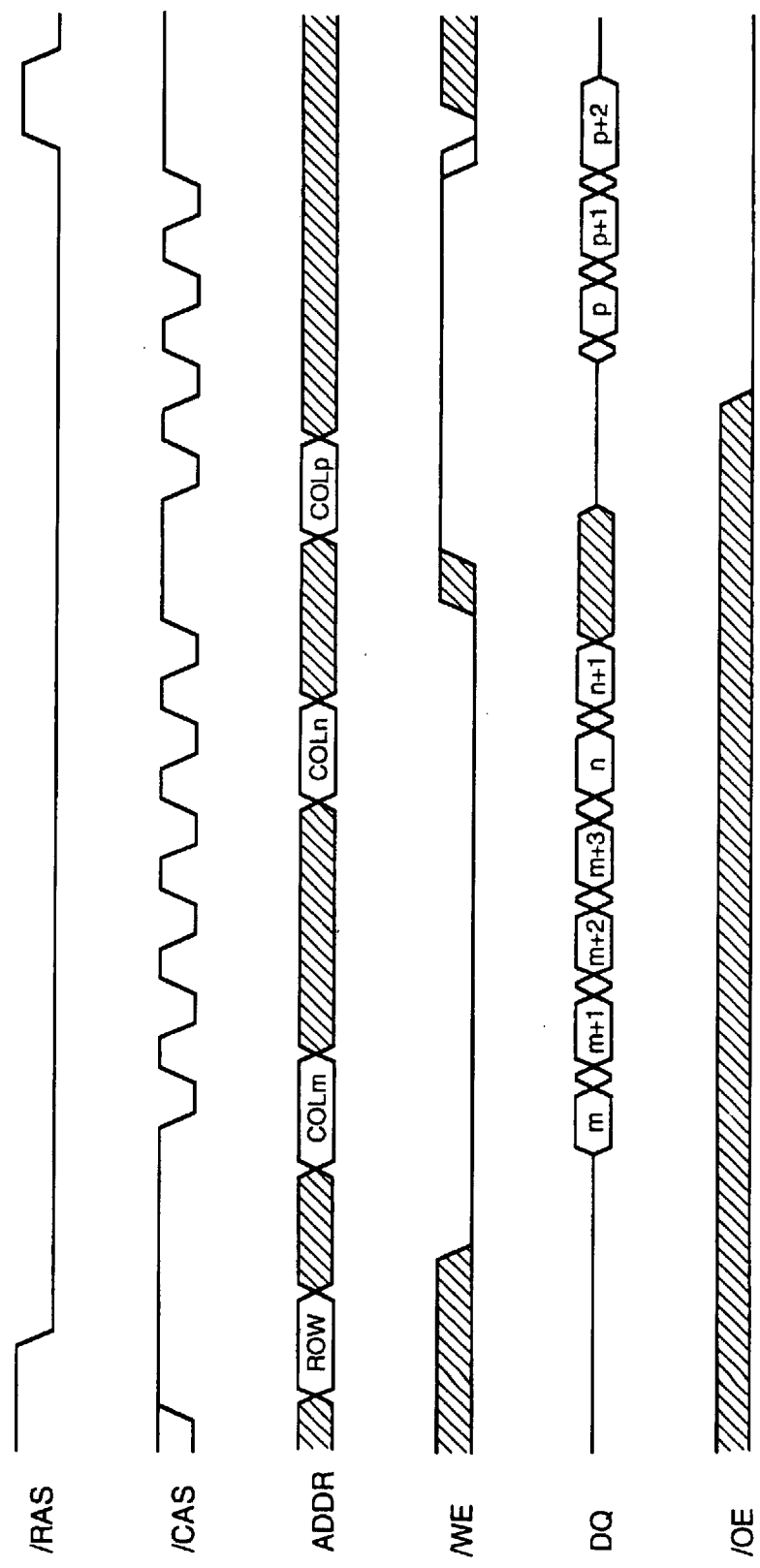
FIG. 5 is a further timing diagram for accessing the device of FIG. 1.

FIG. 5 is a timing diagram depicting burst write access cycles followed by burst read cycles. As in FIG. 4, the /RAS signal is used to latch the row address. The first /CAS falling edge in combination with /WE low begins a burst write access with the first data being latched. Additional data values are latched with successive /CAS falling edges, and the memory address is advanced internal to the device in either an interleaved or sequential manner. On the fifth /CAS falling edge a new column address and associated write data are latched. The burst write access cycles continue until the /WE signal goes high in the sixth /CAS cycle. The transition of the /WE signal terminates the burst write access. The seventh /CAS low transition latches a new column address and begins a burst read access (/WE is high). The burst read continues until /RAS rises terminating the burst cycles.

It should be noted from FIG.'s 3 and 4, that for burst read cycles the data remains valid on the device outputs as long as the /OE pin is low, except for brief periods of data transition. Also, since the /WE pin is low prior to or when /CAS falls, the data input/output lines are not driven from the part during write cycles, and the /OE pin is a "don't care". Only the /CAS signal and the data signals toggle at relatively high frequency, and no control signals other than /CAS are required to be in an active or inactive state for one /CAS cycle time or less. This is in contrast to SDRAMs which often require row address strobes, column address strobes, data mask, and read/write control signals to be valid for one clock cycle or less for various device functions. Typical DRAMs also allow for the column address to propagate through to the array to begin a data access prior to /CAS falling. This is done to provide fast data access from /CAS falling if the address has been valid for a sufficient period of time prior to /CAS falling for the data to have been accessed from the array. In these designs an address transition detection circuit is used to restart the memory access if the column address changes prior to /CAS falling. This method actually requires additional time for performing a memory access since it must allow for a period of time at the beginning of each memory cycle after the last address transition to prepare for a new column address. Changes in the column address just prior to /CAS falling may increase the access time by approximately five nanoseconds. An embodiment of the present invention will not allow the column address to propagate through to the array until after /CAS has fallen. This eliminates the need for address transition detection circuitry, and allows for a fixed array access relative to /CAS. However, it should be understood that the address counter may be advanced early on /CAS in accordance with the present invention.

Figure 6:
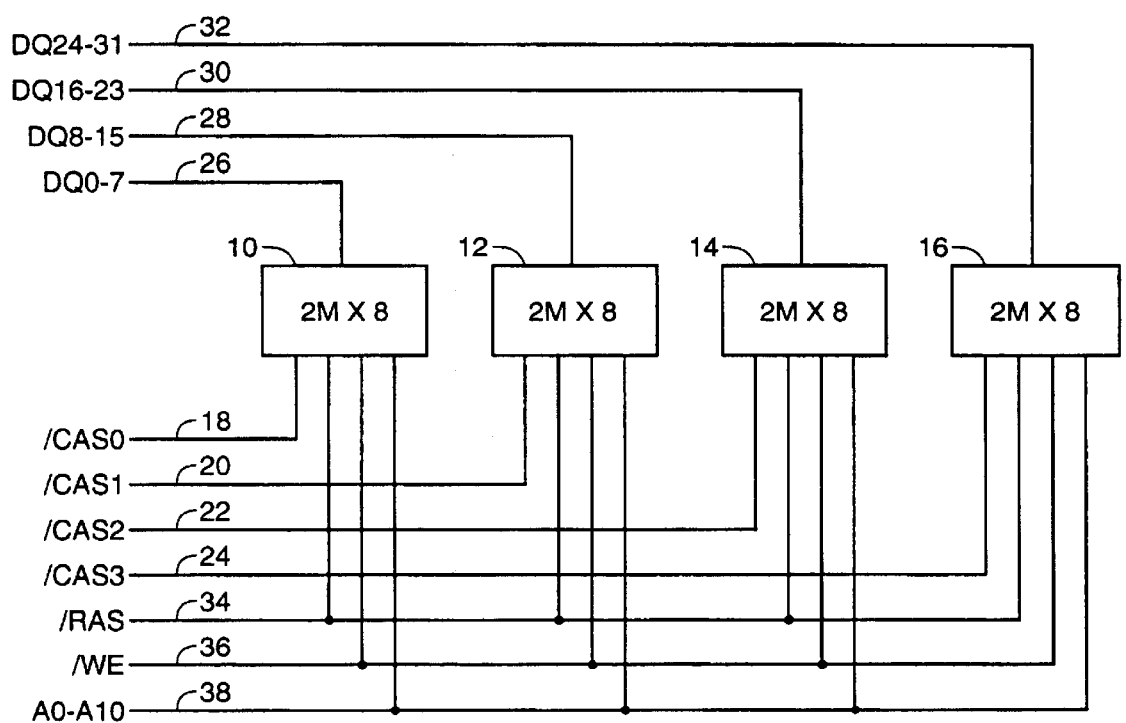
FIG. 6 is an electrical schematic diagram of a Single In-Line Memory Module in accordance with another embodiment of the invention.

FIG. 6 is a schematic representation of a single in-line memory module (SIMM) designed in accordance with the present invention. The SIMM has a standard SIMM module pinout for physical compatibility with existing systems and sockets. Functional compatibility with EDO page mode SIMMs is maintained when each of the 2 Meg×8 memory devices 10, 12, 14 and 16 are operated in an EDO page mode. Each of the /CAS signals 18, 20, 22 and 24 control one byte width of the 32 bit data bus 26, 28, 30 and 32. A /RAS 34 signal is used to latch a row address in each of the memory devices, and is used in combination with /WE 36 to select between page mode and burst mode access cycles. Address signals 38 provide a multiplexed row and column address to each memory device on the SIMM. In burst mode, only active /CAS control lines are required to toggle at the operating frequency of the device, or at half the frequency if each edge of the /CAS signal is used as described above. The data lines are required to be switchable at half of the frequency of the /CAS lines or at the same frequency, and the other control and address signals switch at lower frequencies than /CAS and the data lines. As shown in FIG. 6, each /CAS signal and each data line is connected to a single memory device allowing for higher frequency switching than the other control and address signals. Each of the memory devices 10, 12, 14 and 16 is designed in accordance with the present invention allowing for a burst mode of operation providing internal address generation for sequential or interleaved data access from multiple memory address locations with timing relative to the /CAS control lines after a first row and column address are latched.

Figures 7, 8:
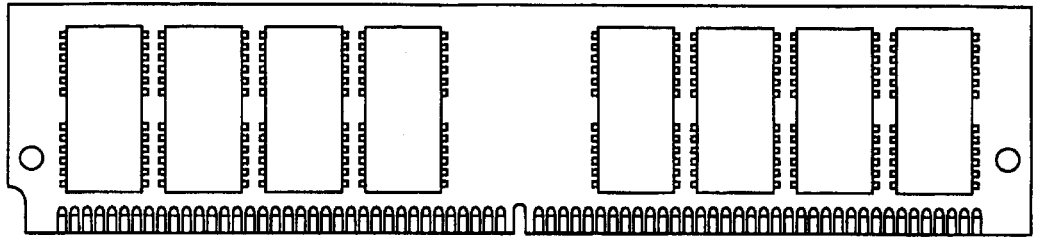
FIG. 7 is a front view of a Single In-Line Memory Module designed in accordance with the teachings of this invention.
FIG. 8 is a table of the pin numbers and signal names of the Single In-Line Memory Module of FIG. 7.

FIG. 7 shows a front view of another SIMM designed in accordance with the present invention. Each device on the SIMM is a 4 Megabit DRAM organized as 1 Meg×4. In this configuration, a single /CAS controls two memory devices to provide access to a byte width of the data bus. The eight devices shown form a 4 Megabyte SIMM in a 32 bit width. For an 8 Megabyte SIMM in a 32 bit width, there are eight additional devices on the back side (not shown).

FIG. 8 shows a preferred pinout for a memory module designed in accordance with the device of FIG. 7. This pinout is compatible with pinouts for Fast Page Mode SIMMs and EDO SIMMs. A presence detect pin is provided for indication of EDO operation on pin 66, and in accordance with standard EDO part types, an /OE input is provided on pin 46.

Alternate embodiments of the SIMM modules of FIG.'s 5, 6 and 7 include the use of two /RAS signals with each controlling a sixteen bit width of the data bus in accordance with standard SIMM module pinouts. Four more 2 M×8 EDO Burst Mode DRAMs may be added to the device of FIG. 6 to provide for a 4 M×32 bit SIMM. Sixteen bit wide DRAMs may also be used, these will typically have two /CAS signals each of which controls an eight bit data width. The incorporation of parity bits, or error detection and correction circuitry provide other possible SIMM module configurations. Methods of performing error detection and/or correction are well known to those of skill in the art, and detailed descriptions of such circuits are not provided in this application. Additional SIMM designs using the novel memory device of the present invention may be designed by one of skill in the art with the aid of this specification. The invention has been described with reference to SIMM designs, but is not limited to SIMMs. The invention is equally applicable to other types of memory modules including Dual In-Line Memory Modules (DIMMs) and Multi-Chip Modules (MCMs).

Burst/Pipelined Mode Embodiment

Figure 9:
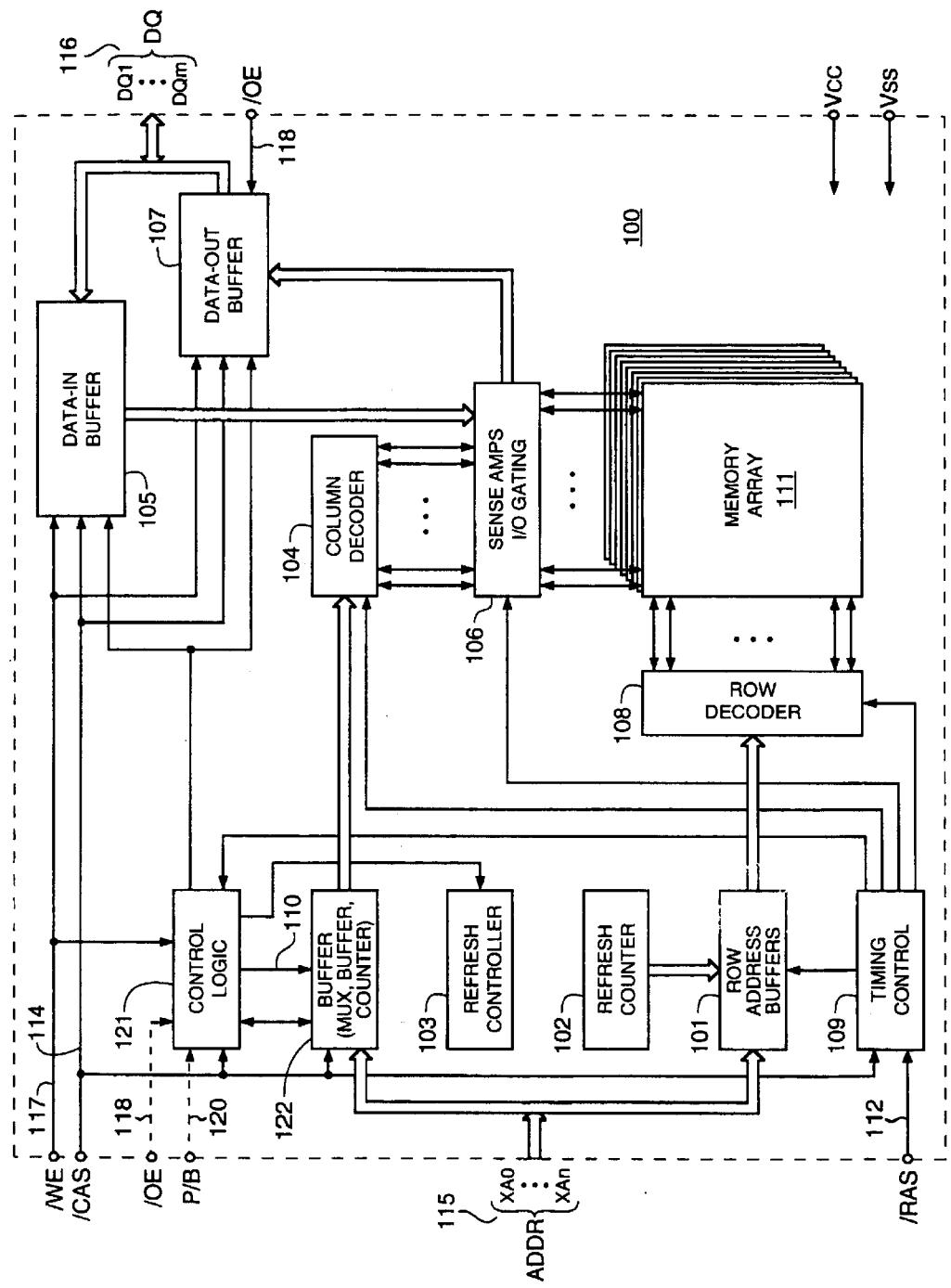
FIG. 9 is a block diagram of an embodiment of an exemplary memory device in accordance with the present invention.

Referring to FIG. 9, there is shown a block diagram of a memory device (memory) 100 in accordance with the present invention. Memory 100 in the embodiment illustrative shown is an asynchronous DRAM. By asynchronous it should be understood that operation of memory 100 need not be synchronized to an external clock signal. In other words, no system clock signal need be applied to memory 100. Consequently, memory 100 is smaller, and requires less circuitry and control pins than an SDRAM.

Memory 100 receives several signals, including /RAS and /CAS signals 112, 114, /WE signal 117, address (ADDR) signal 115, and /OE signal 118. ADDR signal 115 may be made up of input pins (inputs) A0 through An inclusive (A0–An), where n is an integer greater than zero. Multiplexer/Column-Address Buffer 122 is coupled for receiving ADDR signal 115. Furthermore, in accordance with one embodiment of the present invention, an input control signal is provided to memory 100. This is signal is pipelined EDO/burst EDO select (P/B) signal 120, where the "/" indicates that burst mode is active low. P/B signal 120 may be supplied externally to memory 100 (e.g., via a control pin of memory 100) to control logic 121. Alternatively, P/B signal 120 may be omitted for a standard enable signal to generate mode select internal to control logic 121.

Memory 100 includes memory array 111. While memory array 111 is referred to in the singular, it should be understood, as illustratively shown in FIG. 9, that memory array 111 may be made up of one or more addressable memory arrays. Memory 100 may provide an output read from memory array 111 via data (DQ) signal 116. Alternatively, memory 100 is capable of receiving information to be stored in memory array 111 via DQ signal 116. DQ signal 116 is made up of I/O pins DQ 1 through DQm inclusive (DQ1–DQm), where m represents an integer greater than or equal to one. Alternatively, separate data input and output paths may be used.

Memory 100 also includes many known elements such as row address buffers 101, refresh counter 102, refresh controller 103, column decoder 104, data-in buffer 105, data-out buffer 107, I/O gating sense amplifiers 106, row decoder 108, and timing control 109.

Figure 10:
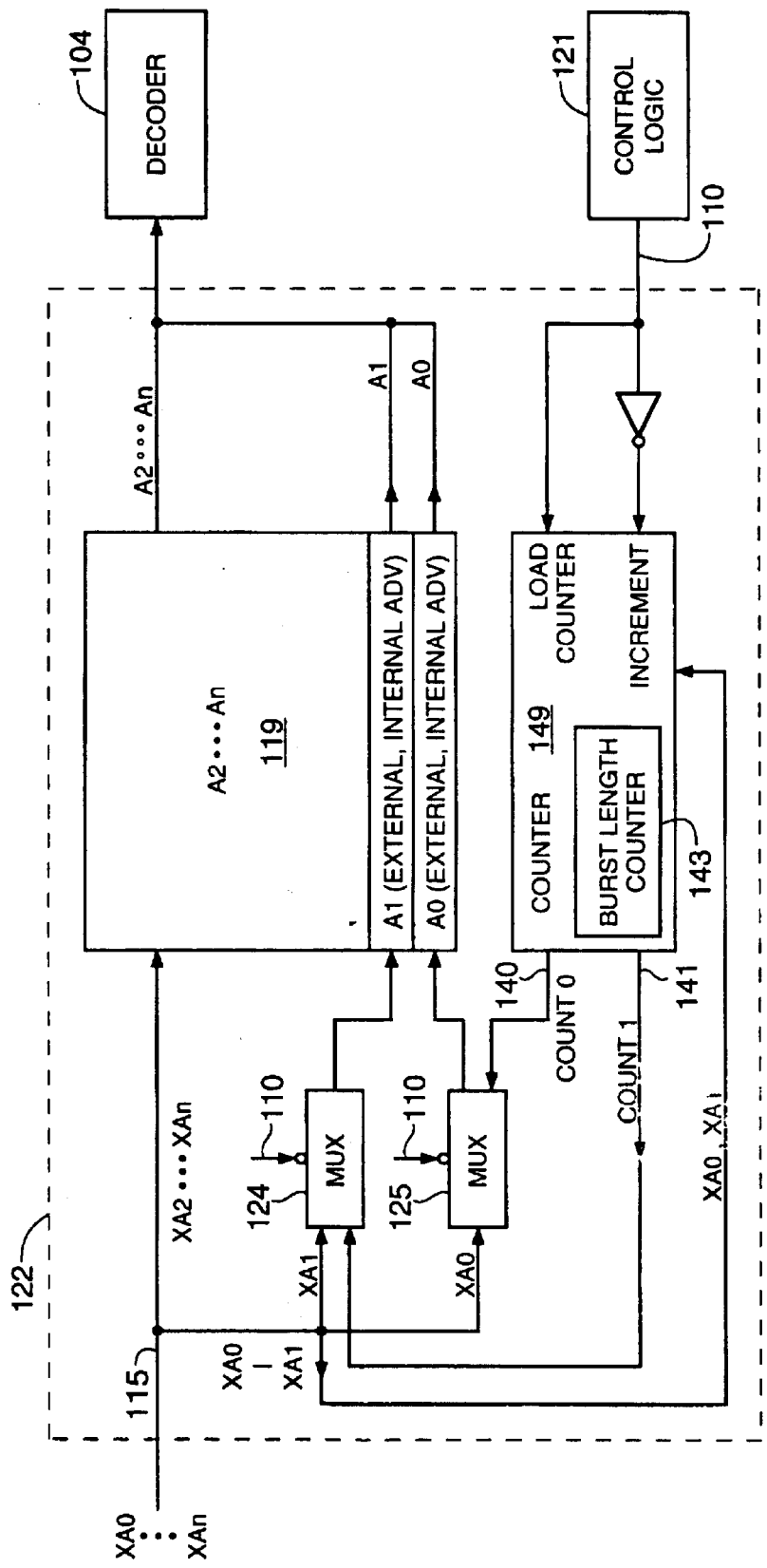
FIG. 10 is a block diagram an embodiment of a portion of the memory device of FIG. 9.

Referring to FIG. 10, there is shown a block diagram of an embodiment of a portion of memory 100 of FIG. 9. ADDR signal 115 provides external inputs XA0–XAn. Inputs XA2–XAn are provided directly to temporary storage 119. Temporary storage 119 may be a latch or other memory device. Input XA1 is provided to multiplexer (MUX) 124, and input XA0 is provided to MUX 125. After which inputs XA1 and XA0 are provided to respective locations in temporary storage 119.

MUXs 124, 125 also receive newburst signal 110 from control logic 121 (shown in FIG. 9). Newburst signal 110 is employed as a select signal as applied to MUXs 124, 125. Thus, if newburst signal 110 is active, memory 100 is in burst mode. Consequently, count 0 and count 1 signals 140, 141 are selected over XA0 and XA1 signals as applied to MUXs 124, 125. If newburst signal 110 is not active, memory 100 is in pipelined mode. As a result, XA0 and XA1 are selected over signals 140, 141 as applied to MUXs 124, 125.

In-burst mode, newburst signal 110 is used to control counter 149 to load and increment values. Counter 149 loads address XA0 and XA1. After a first /CAS signal 114 cycle in burst mode which uses the initial external values supplied for addresses XA0 and XA1, counter 149 increments those initial values and provides new internally generated addresses A0 and A1 by supplying count 0 signal 140 and count 1 signal 141 to respective A0 and A1 locations in temporary storage 119 through MUXs 125, 124. In this manner, internal addresses may be generated based on an initial external address.

While counter 149 is shown as a two (2) bit counter, it will be readily apparent to one with ordinary skill in the art of the present invention that this is merely representative of one embodiment of the present invention. Consequently, it should be understood that other counter sizes may be employed in accordance with the present invention.

Moreover, counter 149 may also include burst length counter 143. In such a case, burst length counter 143 may include a latch for temporarily storing a current burst length count and a comparator for ensuring the count does not exceed a maximum length for a burst sequence.

Figure 11:
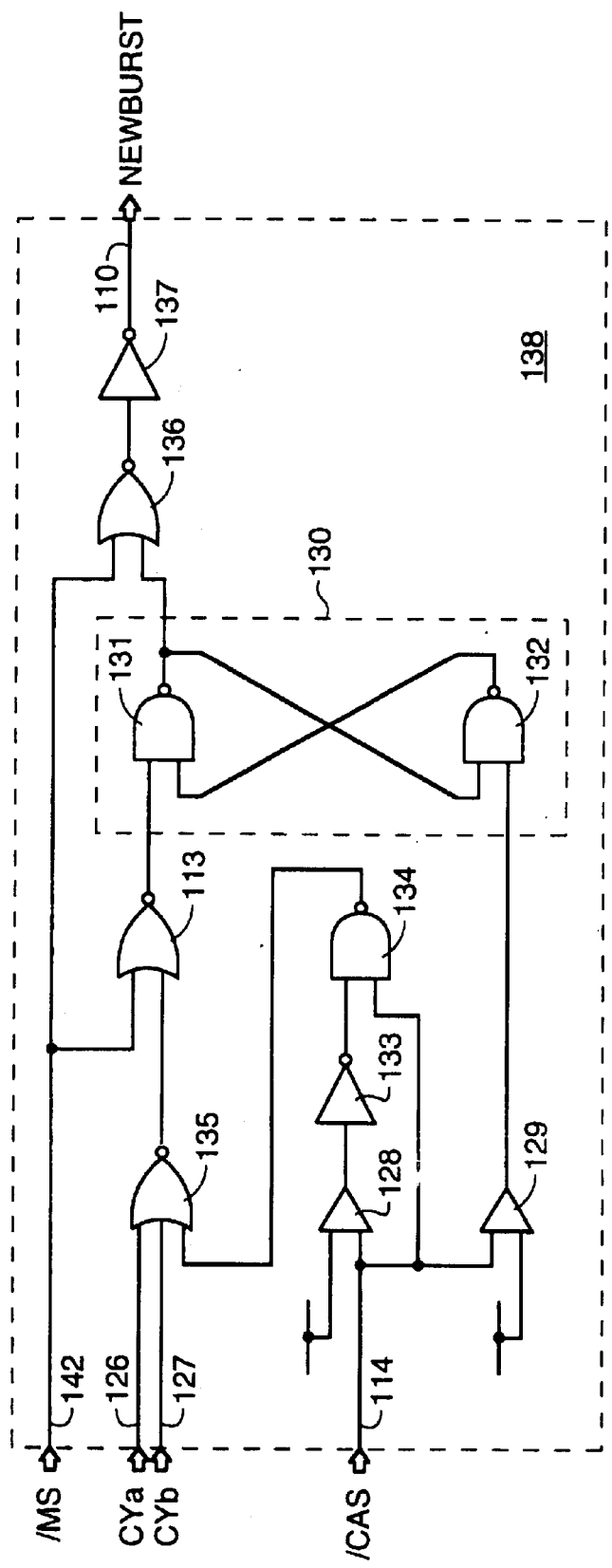
FIG. 11 is a schematic diagram of a portion of control logic of the memory device of FIG. 9.

Referring now to FIG. 11, there is shown a schematic diagram of mode circuitry 138 for generating newburst signal 110 in accordance with the present invention. Mode circuitry 138 is a portion of control logic 121 (shown in FIG. 9). As shown, either /OE signal 118, /WE signal 117, or P/B signal 120 may be used to provide newburst signal 110. CYa and CYb signals 126, 127 are provided by burst length counter 143 (shown in FIG. 10). Newburst signal 110 is employed to reset CYa and CYb signals 126, 127 (for example to binary (1, 1)). Signals 126, 127 are decremented binarily (for example, (1, 1), (1, 0), (0, 1), (0, 0)) such that when an end of a burst length is reached (for example, (0, 0) for a 4-bit burst length), newburst signal 110 is enabled.

/CAS signal 114 is provided to delays 128, 129. In this embodiment, delay 128 is longer than that of delay 129.

Flip-flop 130 is made up of two NAND gates 131, 132. Output from delay 129 is used to reset and enable flip-flop 130.

In the case where burst mode is selected (active low), mode select (/MS) signal 142 will be low. /MS signal 142 may be any of signals 117, 118, 120 or a combination thereof. As /MS signal 142 is low, its input to NOR gates 113, 136 will be low ("logic zero"). Flip-flop 130 will be set such that output from it to NOR gate 136 is also low provided that output from delay 129 is low and that output from NOR gate 135 is low. Output from NOR gate 135 will go high when /CAS signal 114 rises causing a low pulse out of NAND gate 134, and CYa 126 and CYb 127 are both low indicating that the current burst sequence is complete. Both CYb 127 and CYa 126 are set high at the beginning of a burst sequence. Consequently, newburst signal 110 will remain low until burst mode is interrupted or completed.

If pipelined mode is selected, /MS signal 142 will be high. Thus, inputs to NOR gate 136 will be high ("logic one"), and thus newburst signal 110 will remain high until pipelined mode is interrupted.

With renewed reference to FIGS. 9 and 10, the following two examples of operation of memory 100 should be considered.

1. If mode select is active high (e.g., logic "1"), pipelined EDO mode is selected for operation of memory 100. Control logic 121 in response to receiving mode select pipelined information, provides newburst signal 110 to MUX 123 to select external input XA0–XAn. In this manner an external address via ADDR signal 115 may be sent through buffer 122 to decoder 104 for each /CAS signal 114 cycle for pipelined EDO mode. In other words, a new external column address for memory array 111 may be provided for each access to memory 100. Thus, while memory 100 is in pipelined EDO mode, newburst signal 110 instructs buffer 122 to select address input only from ADDR signal 115.

2. Alternatively, if mode select is active low (e.g., logic "0"), burst EDO mode is selected for operation of memory 100. Control logic 121 in response to receiving mode select burst information, provides newburst signal 110 to select input from buffer 122 via temporary storage 119 and counter 149. In this manner, for an access to memory 100, an address sent from buffer 122 to decoder 104 is selected, namely the current external address stored in buffer 122. This address is then incremented in accordance with burst EDO mode by operation of counter 149 and provided to decoder 104 through buffer 122.

It should be readily appreciated that the present invention provides switching between burst and pipelined EDO modes of operation of memory 100 for page mode accessing in either mode.

When accessing several different column locations in a row of memory array 111 (page mode access), a new external column address for each access to memory array 111 may be provided to memory 100 for pipelined EDO mode of operation. Thus, successive external addresses, one for each /CAS signal 114 cycle, may be provided to memory 100. This is particularly useful in applications when column accesses are in a random or a patternless-series of column addresses. By patternless-series, it should be understood to mean a manner of memory addressing which does not have to comport with any predefined scheme.

When accessing several different column locations in a row of memory array 111 (again, page mode access), after receipt of an external address for access to memory array 111, a subsequent, new internal column addresses may be generated by memory 100 for each subsequent access to memory array 111 in burst EDO mode of operation. This is particularly useful in applications when column accesses are in a predefined-series or in a sequence. Such predefined-series and sequential operation include interleaved and linear memory addressing schemes. It should be further understood that successive external addresses, one for each set of /CAS signal 114 cycles, may be provided to memory 100 in accordance with the present invention for continued bursting.

Figure 12:
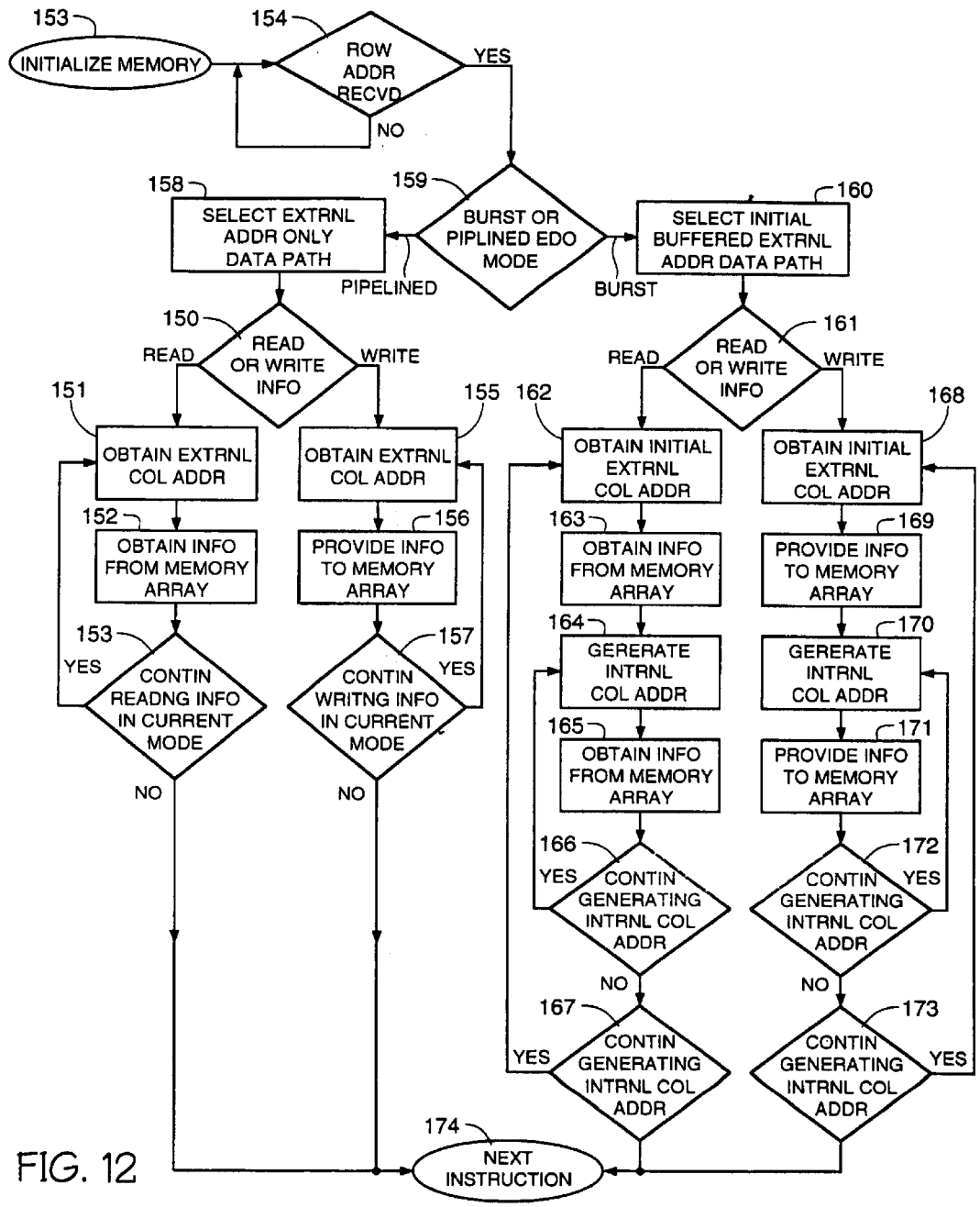
FIG. 12 is a process flow diagram for switching between burst and pipelined modes of operation in accordance with the present invention.

With continued reference to FIG. 9 and reference to FIG. 12, which is a process flow diagram for switching between burst and pipelined EDO modes of operation in accordance with the present invention, one type of switching operation for memory 100 is explained. At step 153, memory 100 is initialized. After which, it is determined whether a row address has been received at step 154. If a row address has not been received, memory 100 stays in wait mode until a row address is received.

If a row address has been received, at step 159 it is determined whether burst or pipelined EDO mode is desired. If pipelined EDO mode is desired, an external address path is selected at step 158. By path or pathway it should be understood to include one or more signals. At step 150, memory 100 is instructed whether to read (output) or write (input) information. If memory 100 is to read information, an external column address is obtained at step 151. Next, at step 152, information is obtained from memory array 111 corresponding to the row address received at step 154 and the external column address obtained at step 151. At step 153, it is determined whether information should continue to be read from memory 100 in the current pipelined EDO mode. If yes, another external column address is obtained at step 151; however, if no, memory 153 must wait for a next instruction.

If at step 150, memory 100 was instructed to write information, then an external column address is obtained at step 155. After which, the appropriate information is provided to memory array 111 at step 156 at a location corresponding to the row address received at step 154 and the external column address obtained at step 155. At step 157, it is determined whether memory 100 is to continue writing information in the current pipelined EDO mode. If yes, then another external column address is obtained at step 155. If no, memory 100 waits for a next instruction at step 174.

If at step 159, it was determined that memory 100 should be in burst EDO mode, then an initial stored external address path is selected at step 160. At step 161 it is determined whether information is to be read or written to memory 100. If information is to be read from memory 100, then at step 162 an initial external column address is obtained. At step 163 information is obtained from memory array 111 at the location specified by the row address received at step 154 and the external column address obtained at step 162.

At step 164, an internal column address is generated for burst EDO mode and an alternative address path for providing internal addresses to temporary storage 119 (shown in FIG. 10) is selected. At step 165, information is obtained from memory array 111 according to the row address specified at step 154 and the internal column address specified at step 164.

At step 166 it is determined whether to continue generating internal column addresses. If yes, at step 164 the next internal column address in the predefined-series is generated. If no, it is determined whether information is to be read from memory 100 in the current mode at step 167. If information is to continue to be read, then another external column address is obtained at step 162. If no, memory 100 waits for a next instruction at step 174.

If at step 161 memory 100 is instructed to write information to memory array 111, then at step 168 an initial external column address is obtained. Next, at step 169, information is provided to memory array 111 at the location specified by the row address received at step 154 and the external column address obtained at step 168.

At step 170, an internal column address is generated in accordance with a predefined-series. At step 171, information is provided to memory array 111 at the location specified by the row address received at step 154 and the internal column address generated at step 170.

At step 172 it is determined whether to continue generating internal column addresses. If internal column addresses are to be continued to be generated, then the next internal column address in the predefined-series is generated at step 170. If no, then at step 173 it is determined whether information is to continue to be written to memory 100 in the burst EDO mode. If yes, then another initial external column address is obtained at step 168. If no, memory 100 waits for a next instruction at step 174.

The present invention facilitates random/patternless-series column accessing (using externally generated addresses exclusively) and predefined-series/sequential column accessing (using an initial externally generated address followed by one or more internally generated addresses). This is done without the additional above-described undesirable features associated with SDRAMs. The present invention provides switching between burst access, and non-burst access or pipelined modes of operation without ceasing ("on-the-fly"). No WCBR cycle is needed with burst/pipelined mode switching during operation. Thus, the ability to increase speed and operating performance is facilitated.

Furthermore, owing to the ability to provide both burst and pipelined EDO modes of operation for memory 100, the present invention facilitates many additional embodiments, some of which are described below.

Figure 13:
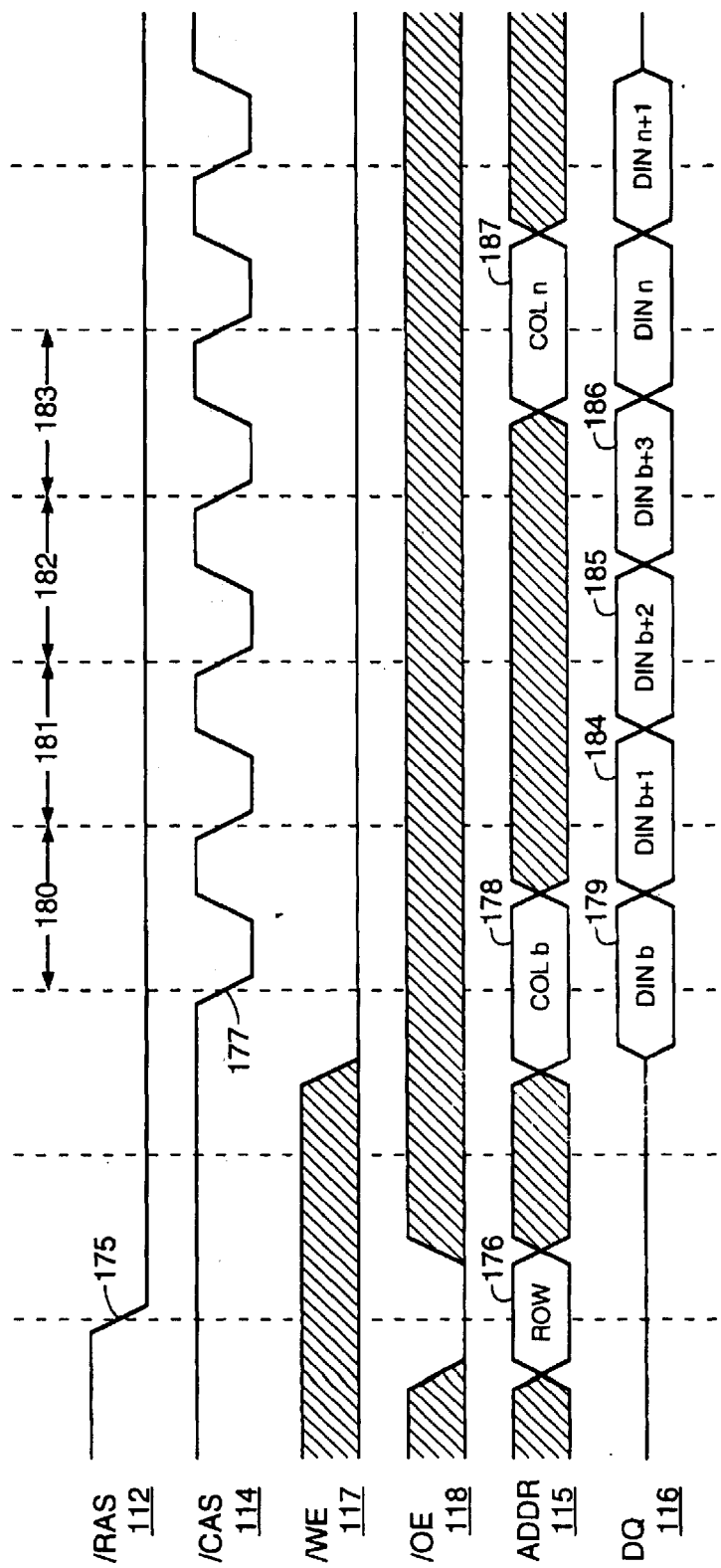
FIGS. 13 and 14 are timing diagrams for burst EDO write and read cycles, respectively, for a row-based switching embodiment in accordance with the present invention.

Referring now to FIG. 13, there is shown a timing diagram illustrative of burst EDO write cycles for a row-based switching embodiment in accordance with the present invention. For row-based switching, either /OE signal 118 or /WE signal 117 may be used for mode select. For example, either /OE signal 118 or /WE signal 117 may be provided to mode circuitry 138 (shown in FIG. 11). Mode circuitry 138 (shown in FIG. 11) may be set by either /OE signal 118 or /WE signal 117 when /RAS signal 112 is active. Thus, any need for an external mode select control signal is eliminated. Mode circuitry 138 (shown in FIG. 11) may be set for the duration of a current row access (page mode access), and /OE signal 118 and /WE signal 117 retain their functionality for one or more column accesses on the current row.

/RAS signal 112 transitions to active low at time 175. At which time, /OE signal 118 is active low for selecting burst EDO mode, and /OE signal 118 is a "don't care" condition for the remainder of /RAS signal 112 for the current write cycles. (e.g., /CAS cycles 180 through 183, inclusive).

At time 175, ADDR signal 115 has provided row address 176. Row address 176 indicates which row in memory array 111 (shown in FIG. 9) is to be accessed. Thus, row address 176 is latched by transition of /RAS signal 112 from high to low at time 175.

At time 177, /CAS signal 114 transitions to active low. At which time /WE signal 117 is active low. Consequently, memory 100 (shown in FIG. 9) is instructed to write information to memory array 111 (also shown in FIG. 9). Also, at time 177, ADDR signal 115 provides an initial external column address (COL b) 178. Address 178 indicates a location on row 176 in which writing of information is to begin. Accordingly, data (DIN b) 179 from DQ signal 116 is input to memory 100 (shown in FIG. 9).

Column address 178 is advanced on subsequent /CAS signal 114 cycles 181 through 183, inclusive (181–183). Accordingly, data (DIN b+1, DIN b+2, and DIN b+3) 184 through 186, inclusive, is stored on each cycle 181–183, respectively.

After the fourth memory access, a new external address 187 is applied via ADDR signal 115 for further inputting of information to memory 100 (shown in FIG. 9) without any /CAS cycle latency.

Figure 14:
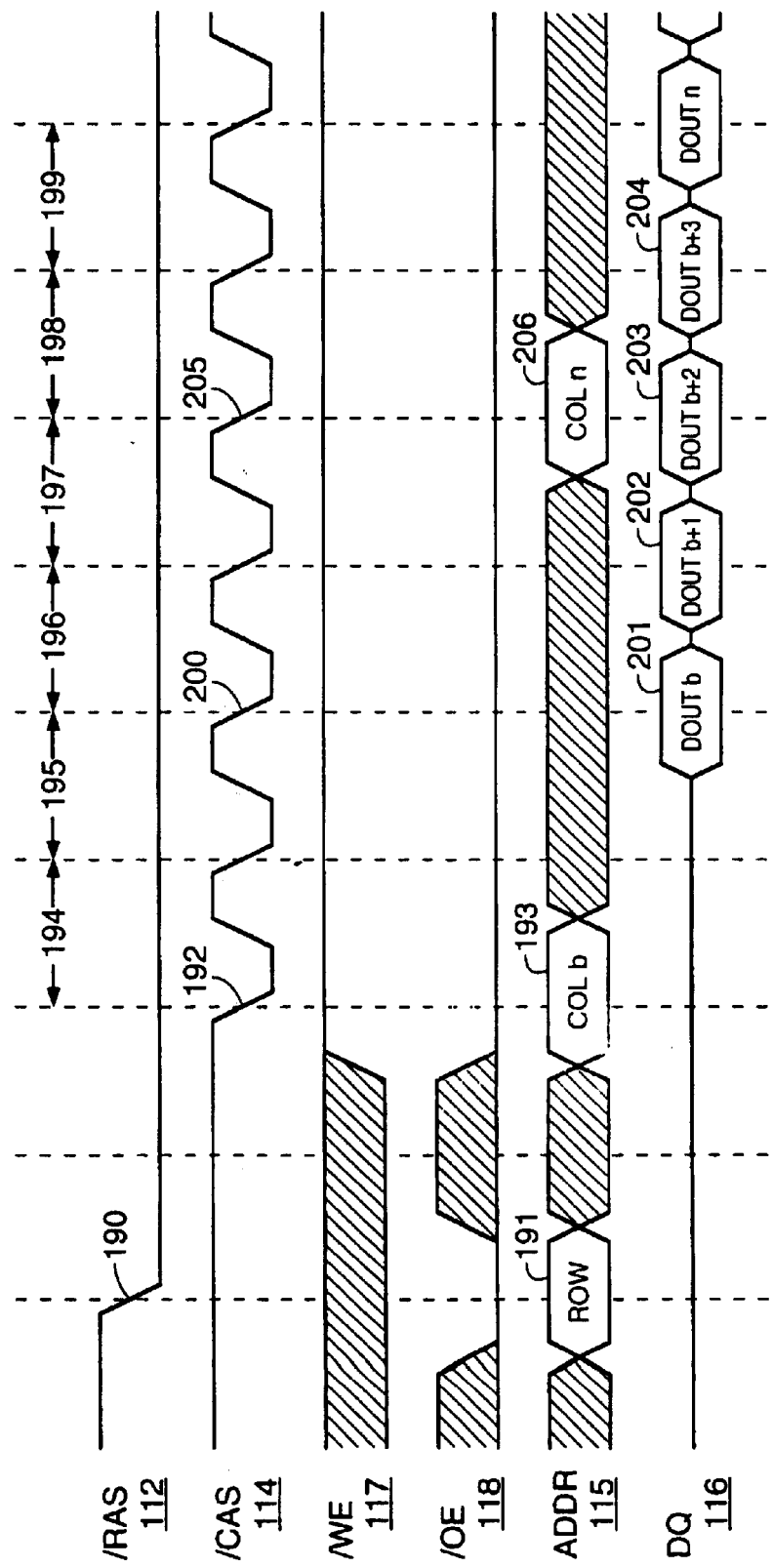

Referring to FIG. 14, there is shown a timing diagram illustrative of burst EDO read cycles for a row-based switching embodiment in accordance with the present invention. /RAS signal 112 transitions to active low at time 190. At which time, /OE signal 118 is active low for selecting burst EDO mode, and ADDR signal 115 has provided row address 191, namely a row in memory array 111 (shown in FIG. 9) to be accessed. Row address 191 is latched by transition of /RAS signal 112 from high to low at time 190.

At time 192, /CAS signal 114 transitions to active low, latching column address (COL b) 193. Address 193 is an externally generated address provided to memory 100 (shown in FIG. 9) via ADDR signal 115. As /WE signal 117 is high (inactive) at time 192, memory 100 (shown in FIG. 9) is instructed to read information from memory array 111 (also shown in FIG. 9). After /CAS cycle 194, an additional /CAS cycle takes place, namely /CAS cycle 195, for a two /CAS signal 114 cycle latency (cycles 194 and 195). Notably, for continued, successive bursting, only the initial two /CAS cycle latency is incurred.

By time 200, the beginning of the third /CAS cycle (/CAS cycle 196), data (DOUT b) 201 from row 191, column 193 is valid. DOUTb is outputted a tCAC (access time from /CAS) from the beginning of the second CAS cycle 195, and is outputted along DQ signal 116. After cycle 194, on each following /CAS cycle 195 through 197, inclusive, an internal address is generated for outputting data (DOUT b+1, b+2, and b+3) 202, 203, and 204, respectively, on DQ signal 116. Meanwhile at time 205, a new external column address 206 is latched by transition of /CAS signal 114 from high to low.

Figure 15:
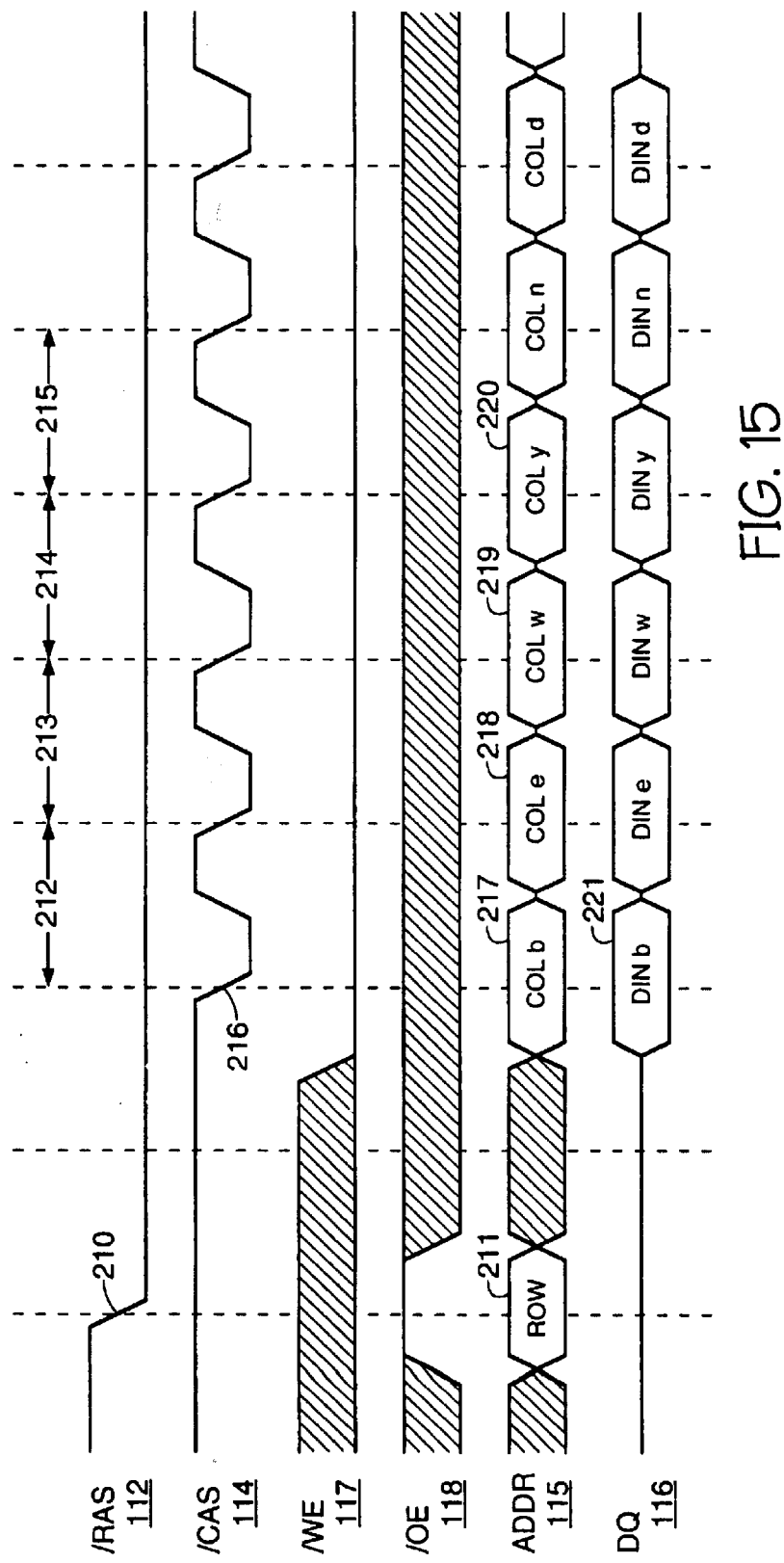
FIGS. 15 and 16 are timing diagrams for pipelined EDO write and read cycles, respectively, for the row-based switching embodiment of FIGS. 13 and 14.

Referring to FIG. 15, there is shown a timing diagram illustrative of pipelined EDO write cycles for a row-based switching embodiment in accordance with the present invention. /RAS signal 112 transitions to active low at time 210, latching row address 211. As /OE signal 118 is high at time 210, pipelined mode is selected. As /WE signal 117 is low at time 216, memory 100 (shown in FIG. 9) is instructed to write information to memory array 111 (shown in FIG. 9).

At time 216, /CAS 114 transitions from high to low to begin /CAS cycle 212. This transition causes row address 211 and external column address (COL b) 217 to be accessed for writing data (DIN b) 221 from DQ signal 116 to memory array 111 (shown in FIG. 9). On the next and following /CAS cycles (e.g., /CAS cycles 213, 214, 215), a random or patternless series of external column addresses (e.g., external column addresses 218, 219, 220) may be received for writing data (e.g., DIN e, w, y) from DQ signal 116 to memory 100 (shown in FIG. 9). Receiving of external addresses may continue thereafter without any /CAS cycle latency.

Figure 16:
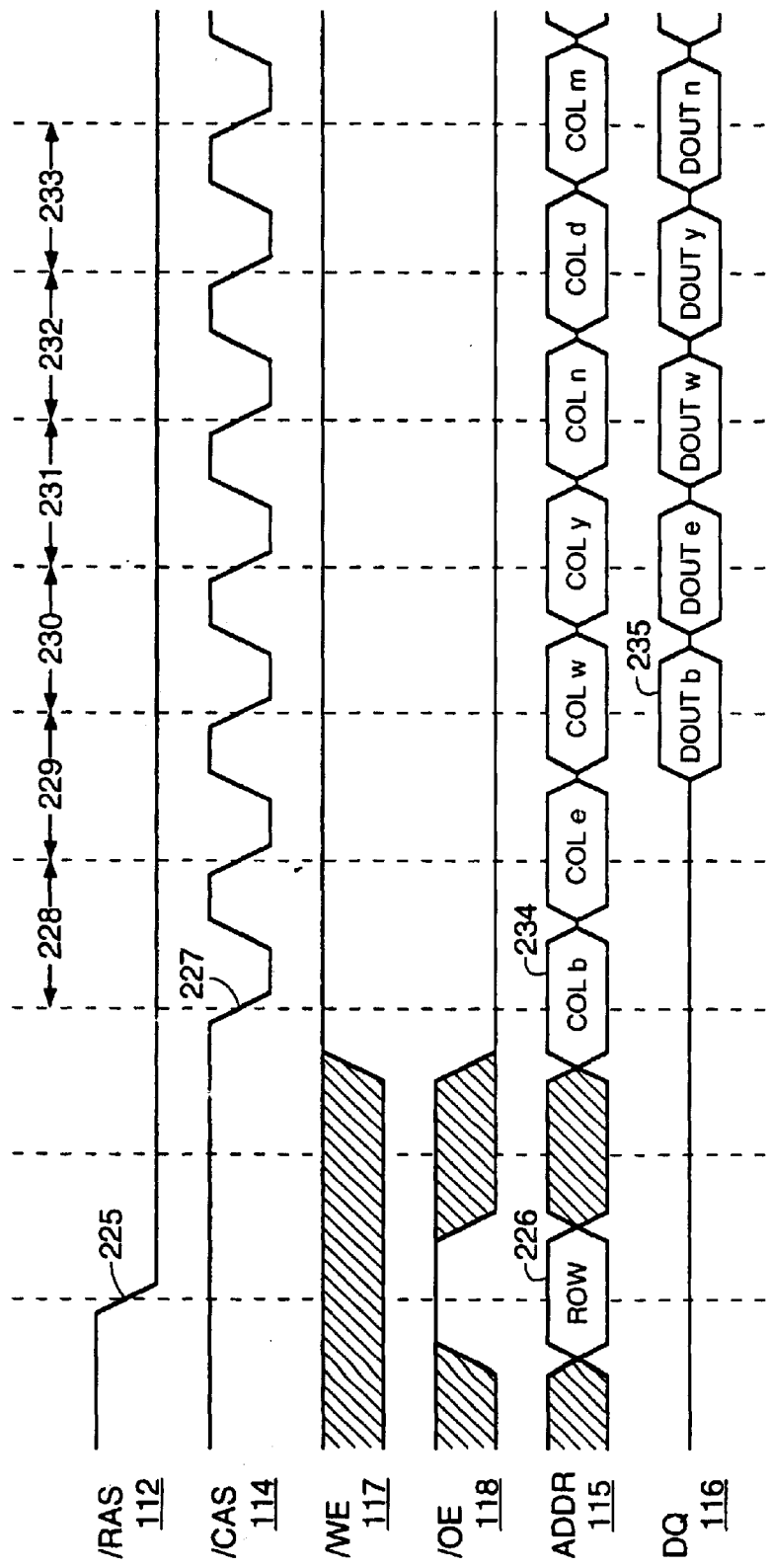

Referring now to FIG. 16, there is shown a timing diagram illustrative of pipelined EDO read cycles for a row-based switching embodiment in accordance with the present invention. At time 225, /RAS signal 112 transitions to active low, and row address 226 is latched from ADDR signal 115. Also, at time 225, /OE signal 118 is high, and thus pipelined mode is selected. At time 227, /WE signal 117 is high, and thus memory 100 (shown in FIG. 9) is instructed to read from memory array 111 (also shown in FIG. 9).

At time 227, /CAS signal 114 begins cycling, and consequently external column address (COL b) 234 may be provided to MUX 123 (shown in FIG. 9). Moreover, a new external column address (e.g., COL e, w, y, n, d, m) may be provided to MUX 123 (shown in FIG. 9) on each subsequent /CAS cycle 229 through 233, inclusive. However, there is a two /CAS cycle latency, namely /CAS cycles 228, 229, from time 227 when external column address 234 is received and reading or outputting data (DOUT b) 235 associated with address 234 onto signal DQ 116.

While this row-based switching embodiment has been illustratively shown having four /CAS cycles prior to initiation of receipt of a new external address while in burst EDO mode, it will be appreciated by those of ordinary skill in the art of the present invention that fewer or more /CAS cycles may be used. Furthermore, while data out was incrementally increased (i.e., b, b+1, et al.) for purposes of illustration of burst EDO write and read operations, it will be appreciated by those of ordinary skill in art of the present invention that an interleaved or another patterned, internally generated addressing scheme may be employed. Also, /WE signal 117 was not used for mode selection in this example; however, it will be readily appreciated to those of ordinary skill in the art of the present invention that /WE signal 117 may be used instead of /OE signal 118 for mode selection.

As mentioned above, the present invention facilitates many embodiments in addition to row-based switching. By way of example and not limitation, some other possible embodiments are described herein.

In column-based switching, switching between burst EDO and pipelined EDO modes is accomplished on successive /CAS cycles. Moreover, this type of switching may be accomplished on either read or write cycles, e.g., from a burst EDO read cycle to a pipelined EDO read cycle and vice-versa, or from a burst EDO write cycle to a pipelined EDO write cycle and vice-versa.

Figure 17:
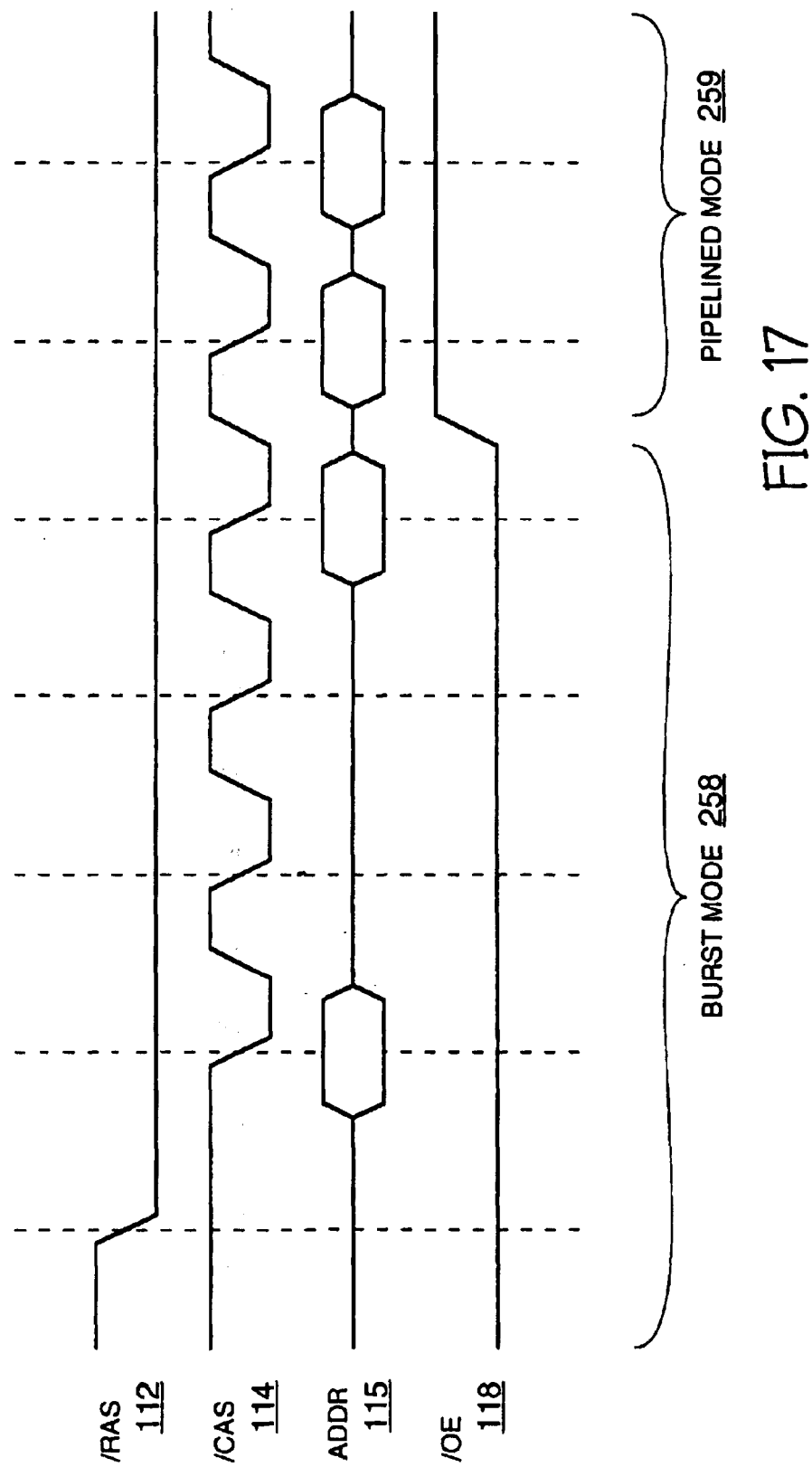
FIG. 17 is a timing diagram for a column-based switching embodiment in accordance with the present invention.

For this embodiment, /OE signal 118 functionality must be changed, as it is used to disable output drivers, to be used as an input for mode selection (i.e., a signal equivalent to P/B 120). For example, referring to FIG. 17, there is shown a timing diagram for column-base switching in accordance with the present invention. When /OE signal 118 is low, memory 100 (shown in FIG. 9) operates in burst mode 256, and when /OE signal 118 is high, memory 100 (shown in FIG. 9) operates in pipelined mode 259.

In application-based switching, a WCBR (write /CAS before /RAS) program cycle following a memory 100 (shown in FIG. 9) initialization routine may be applied to mode circuitry 138 (shown in FIG. 11) to select a desired EDO mode. In such a case, memory 100 (shown in FIG. 9) remains in a selected EDO mode until powered down or until another WCBR programming cycle is executed to change the mode. This type of switching may be employed where a user desires to use burst EDO mode for one or more applications and pipelined EDO mode for one or more other applications. Moreover, an additional external pin may be employed for providing /OE signal 118 to memory 100 (shown in FIG. 9).

In fixed access-based switching, burst address counter 149 (shown in FIG. 9) may be employed for read operations, and external addressing may be employed for write operations. In other words, burst EDO mode may be used for read operations, and pipelined EDO mode may be used for write operations. In such a case, /WE signal 117 may be applied to mode circuitry 138 (shown in FIG. 11) such that when /WE signal 117 is logic low, memory 100 is in pipelined EDO mode, and when /WE signal 117 is logic high, memory 100 is in burst EDO mode. This implementation requires no redefinition of control signals.

Other types of switching include combinations of the above examples. By way of example and not limitation, a fixed burst-read/pipelined-write operation could be combined with a WCBR programming cycle (like that described in application-based switching) to allow either fixed access-based switching or row-based switching.

Figure 18:
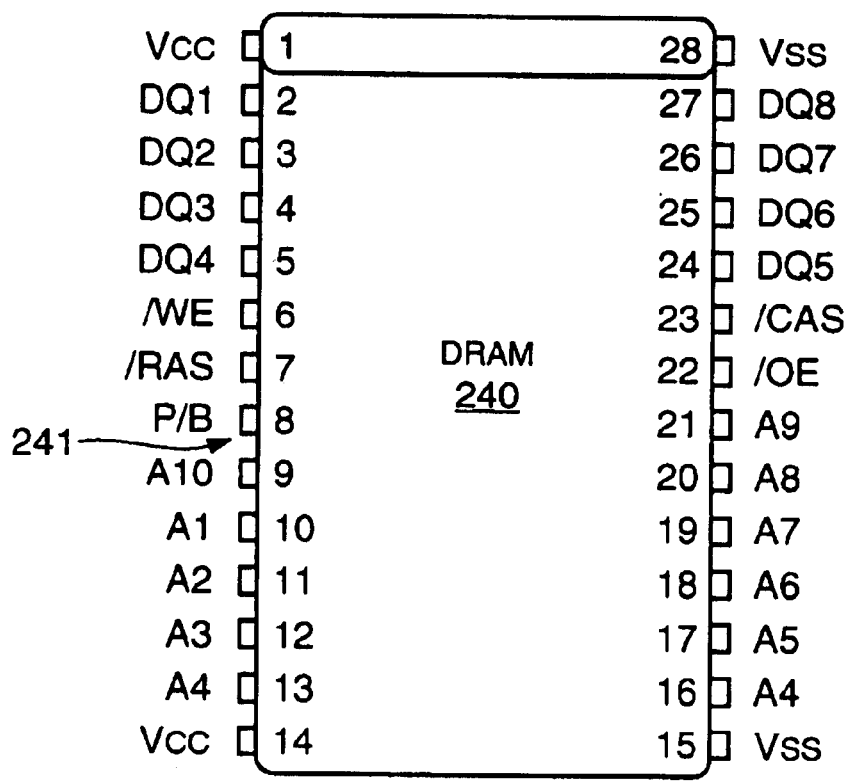
FIG. 18 is a top elevation view of a pinout diagram of an exemplary Dynamic Random Access Memory in accordance with the present invention.

Referring now to FIG. 18, there is shown a top elevation view of a pinout diagram of an memory (DRAM) 240 in accordance with the present invention. DRAM 240 has a standard pinout, except for pin 241 (i.e., pin number eight). Pin 241 has been changed from a NC (no connect) pin, as shown in FIG. 3, to a P/B control signal 120 (shown in FIG. 9) pin for selecting between burst EDO and pipelined EDO modes of operation. As mentioned elsewhere herein, an external control signal for mode selection between burst EDO and pipelined EDO need not be present. In such a case, logic internal to DRAM 240 is employed for selecting between two modes, and thus the pinout of such a DRAM would be the same as that shown in FIG. 3.

Figure 19:
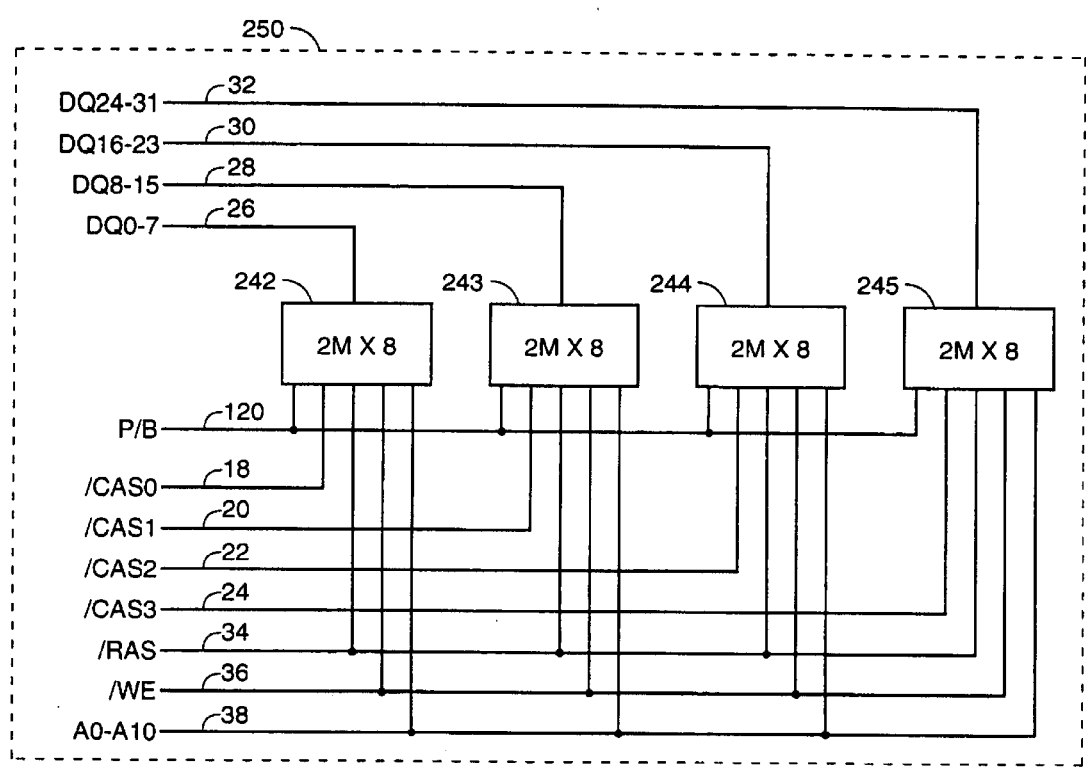
FIG. 19 is a block diagram of an exemplary Single In-Line Memory Module in accordance with the present invention.

Referring to FIG. 19, there is shown a block diagram of a memory module (SIMM) 250 in accordance with the present invention. SIMM 250 is similar to that shown FIG. 6, except that P/B control signal 120 is applied to a pin on each DRAM 242 through 245, inclusive. DRAMs 242 through 245 are similar to that of FIG. 17. Of course, if DRAMs 242 through 245 had internal logic for mode selection, no additional providing of P/B signal 120 (shown in FIG. 9) would be necessary. In which case, SIMM 250 may be like that of FIG. 6.

Figure 20:
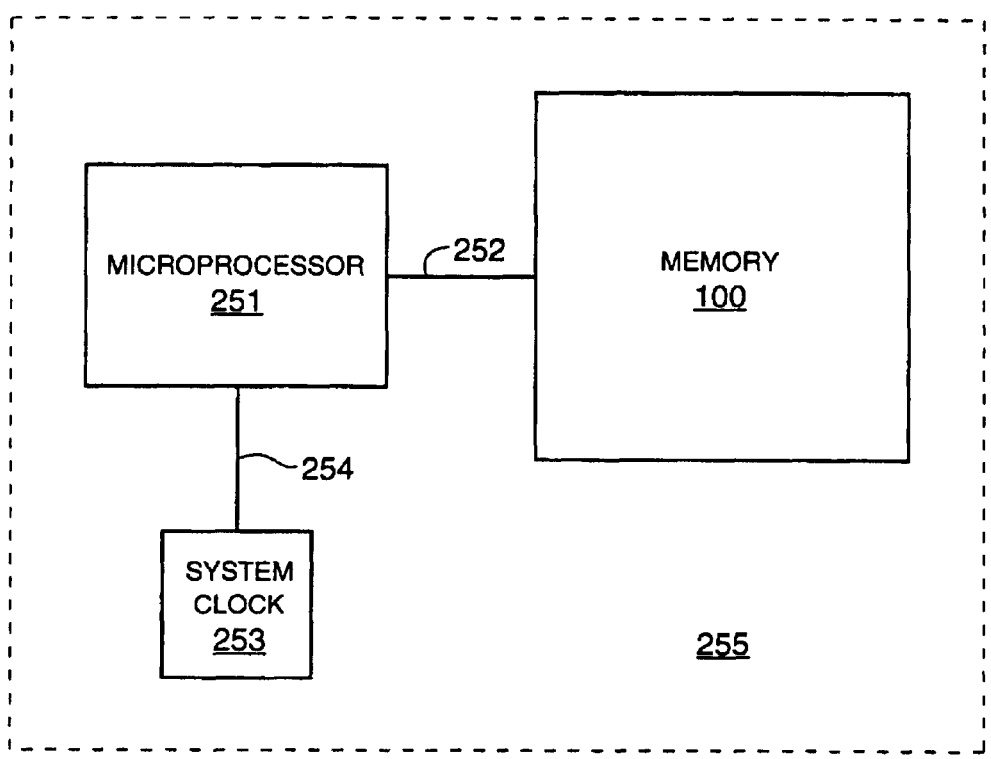
FIG. 20 is a block diagram of an exemplary system embodiment in accordance with the present invention.

Referring to FIG. 20, there is shown system 255 in accordance with the present invention. As illustratively shown, microprocessor 251 is coupled to memory 100, as well as system clock 253. Notably system clock 253 is not directly coupled to memory 100, but is coupled through microprocessor 251.

The present invention has been particularly shown and described with respect to certain preferred embodiments and features thereof. However, it should be readily apparent to those of ordinary skill in the art that various changes and modifications in form and detail may be made without departing from the spirit and scope of the present invention as set forth in the appended claims. The present invention illustratively disclosed herein may be practiced without any element which is not specifically disclosed herein.

What is claimed is:

1. A storage device comprising:
   control logic for selecting between a patternless addressing scheme and a patterned addressing scheme; and
   switching circuitry for switching between a first pathway and a second pathway depending on which of said patternless addressing scheme and said patterned addressing scheme is selected.

2. A storage device, as in claim 1, wherein the storage device is asynchronous.

3. A storage device, as in claim 1, wherein the first pathway and the second pathway are coupled to a temporary storage device for providing at least one external address to the switching circuitry.

4. A storage device, as in claim 3, wherein the external address is temporarily stored in the temporary storage device prior to being sent to a decoder.

5. A storage device, as in claim 4, further comprising a counter coupled to the temporary storage device to receive a selected portion of the external address for generating an internal address.

6. A storage device, as in claim 5, wherein the internal address is provided to the temporary storage device through the switching circuitry.

7. A storage device, as in claim 6, wherein the patternless addressing scheme provides a pipelined extended data out pattern.

8. A storage device, as in claim 7, wherein the patterned addressing scheme provides a burst extended data out pattern.

9. A storage device, as in claim 8, wherein the switching circuitry includes at least one multiplexed device.

10. A storage device, as in claim 1, wherein the patternless addressing scheme is for a random column address access, and the patterned addressing scheme is for a sequential column address access.

11. A storage device, as in claim 10, wherein the sequence column address access is selected from a group consisting of an interleaved column address access and a linear column address access.

12. A memory device, comprising:
    a memory array;
    control logic operatively connected to the memory array, the control logic for selecting between an unpatterned pipeline and a patterned burst scheme for accessing the memory array; and
    switching circuitry for switching between a first pathway and a second pathway depending on which of said pipeline scheme and said burst scheme is selected.

13. A memory device, comprising:
    a memory array operable in a burst or a pipeline mode of operation;
    control logic for selecting between the burst or the pipeline mode of operation; and
    switching circuitry for switching between a first, burst data pathway and a second, pipeline data pathway depending on which of the burst or pipeline modes of operation is selected.

14. A dynamic random access memory, comprising:
a plurality of addressable memory arrays;
a column address decoder for receiving an external column address;
control logic for selecting between a burst or a pipeline mode of operation; and
switching circuitry for switching between a burst pathway and a pipeline pathway depending on which of the burst or pipeline modes of operation is selected.

15. A storage device comprising:
control logic for selecting between a patternless addressing scheme and a patterned addressing scheme;
a counter; and
switching circuitry for switching between a first pathway and a second pathway depending on which of said patternless addressing scheme and said patterned addressing scheme is selected, wherein the first pathway and the second pathway are coupled to a temporary storage device for providing at least one external address to the switching circuitry, and wherein the counter is coupled to the temporary storage device to receive a selected portion of the external address for generating an internal address.

16. The storage device of claim 15, wherein the internal address is provided to the temporary storage device through the switching circuitry.

17. The storage device of claim 15, wherein the patternless addressing scheme provides a pipelined extended data out pattern.

18. A storage device comprising:
control logic for selecting between a patternless addressing scheme and a patterned addressing scheme; and
switching circuitry for switching between a first pathway and a second pathway depending on which of said patternless addressing scheme and said patterned addressing scheme is selected, wherein the patternless addressing scheme provides a pipelined extended data out pattern.

19. The storage device of claim 18, wherein the patterned addressing scheme provides a burst extended data out pattern.

20. The storage device of claim 18, wherein the switching circuitry includes at least one multiplexed device.

21. A storage device comprising:

control logic for selecting between a patternless addressing scheme and a patterned addressing scheme; and switching circuitry for switching between a first pathway and a second pathway depending on which of said patternless addressing scheme and said patterned addressing scheme is selected, wherein the patterned addressing scheme provides a burst extended data out pattern.

22. The storage device of claim 21, wherein the switching circuitry includes at least one multiplexed device.

23. A memory device, comprising:

a memory array operable in a burst mode of operation or a pipelined mode of operation;

control logic for selecting between the burst mode of operation or the pipelined mode of operation; and switching circuitry for switching between a first, burst data pathway and a second, pipeline data pathway depending on which of the burst or pipelined modes of operation is selected, wherein the first pathway and the second pathway are coupled to a temporary storage device for providing at least one external address to the switching circuitry.

24. The memory device of claim 23, further comprising a counter coupled to the temporary storage device to receive a selected portion of the external address for generating an internal address.

* * * * *

UNITED STATES PATENT AND TRADEMARK OFFICE
CERTIFICATE OF CORRECTION

PATENT NO. : 7,103,742 B1
APPLICATION NO. : 08/984560
DATED : September 5, 2006
INVENTOR(S) : Mailloux et al.

It is certified that error appears in the above-identified patent and that said Letters Patent is hereby corrected as shown below:

On the Title page, in Item (54) in "Title" in column 1, line 1, delete "BURST/ PIPELINED EDO MEMORY DEVICE" and insert -- MEMORY DEVICE WITH PATTERNED AND PATTERNLESS ADDRESSING --, therefor.

On the Title page, in field (56), under "Foreign Patent Documents", in column 2, line 1, after "7/1996" insert -- G11C 7/00 --.

On the Title page, in field (56), under "Other Publications", in column 2, line 4, delete "C218" and insert -- C-218 --, therefor.

On page 2, in field (56), under "Other Publications", in column 1, line 2, delete "A-137-A-159" and insert -- A-137 - A-159 --, therefor.

On page 2, in field (56), under "Other Publications", in column 1, line 9, after "Rev" insert -- . --.

On page 2, in field (56), under "Other Publications", in column 2, line 3, after "Table"" insert -- , --.

On page 2, in field (56), under "Other Publications", in column 2, line 4, after "Electronics" insert -- , --.

On page 2, in field (56), under "Other Publications", in column 2, line 5, after "SDRAM"" insert -- , --.

On page 2, in field (56), under "Other Publications", in column 2, line 8, after "News" insert -- , --.

On page 2, in field (56), under "Other Publications", in column 2, line 11, after "1-30" delete ",," and insert -- , --, therefor.

On page 2, in field (56), under "Other Publications", in column 2, line 23, delete "Cutsom" and insert -- Custom --, therefor.

On page 2, in field (56), under "Other Publications", in column 2, line 25, after "Inc." insert -- , --.

On page 2, in field (56), under "Other Publications", in column 2, line 34, after "Book"" insert -- , --.

UNITED STATES PATENT AND TRADEMARK OFFICE
CERTIFICATE OF CORRECTION

PATENT NO.        : 7,103,742 B1
APPLICATION NO. : 08/984560
DATED              : September 5, 2006
INVENTOR(S)       : Mailloux et al.

It is certified that error appears in the above-identified patent and that said Letters Patent is hereby corrected as shown below:

On Sheet 11 of 19, in FIG. 12 (Block 164), line 1, delete "GERERATE" and insert -- GENERATE --, therefor.

On Sheet 11 of 19, in FIG. 12 (Block 170), line 1, delete "GERERATE" and insert -- GENERATE --, therefor.

In column 1, line 1, delete "BURST/PIPELINED EDO MEMORY DEVICE" and insert -- MEMORY DEVICE WITH PATTERNED AND PATTERNLESS ADDRESSING --, therefor.

In column 1, line 13, after "are" insert -- copending --.

In column 1, line 21, delete "0497,354" and insert -- 08/497,354 --, therefor.

In column 1, line 48, delete "dense" and insert -- denser --, therefor.

In column 6, line 8, delete "2 Meg×8" and insert -- 2 Meg × 8 --, therefor.

In column 6, line 12, delete "active-low" and insert -- active low --, therefor.

In column 7, line 34, delete "advance" and insert -- advanced --, therefor.

In column 7, line 62, after "possible" delete "," and insert -- : --, therefor.

In column 8, line 22, delete "10" and insert -- I/O --, therefor.

In column 9, line 17, delete "not't" and insert -- not --, therefor.

In column 9, line 34, after "increase" insert -- , --.

In column 11, line 60, delete "2 Meg×8" and insert -- 2 Meg × 8 --, therefor.

In column 12, line 20, delete "1 Meg×4" and insert -- 1 Meg × 4 --, therefor.

In column 12, line 37, delete "2 M×8" and insert -- 2 M × 8 --, therefor.

In column 12, line 39, delete "4 M×32" and insert -- 4 M × 32 --, therefor.

In column 13, line 6, after "This" delete "is".

In column 13, line 22, delete "DQ 1" and insert -- DQ1 --, therefor.

UNITED STATES PATENT AND TRADEMARK OFFICE
CERTIFICATE OF CORRECTION

PATENT NO. : 7,103,742 B1
APPLICATION NO. : 08/984560
DATED : September 5, 2006
INVENTOR(S) : Mailloux et al.

It is certified that error appears in the above-identified patent and that said Letters Patent is hereby corrected as shown below:

In column 13, line 28, delete "data-out" and insert -- data out --, therefor.

In column 13, line 51, delete "In-burst" and insert -- In burst --, therefor.

In column 15, line 30, delete "of/CAS" and insert -- of /CAS --, therefor.

In column 17, line 59, delete "DOUTb" and insert -- DOUT b --, therefor.

In column 19, line 5, delete "256" and insert -- 258 --, therefor.

Signed and Sealed this

Third Day of April, 2007

JON W. DUDAS
*Director of the United States Patent and Trademark Office*